(12) United States Patent
Opie

(10) Patent No.: US 12,419,017 B2
(45) Date of Patent: Sep. 16, 2025

(54) MODULAR RUGGED COOLED ACTUATOR CONTROL SYSTEM

(71) Applicant: Moog Inc., East Aurora, NY (US)

(72) Inventor: Ray Opie, Orchard Park, NY (US)

(73) Assignee: Moog Inc., East Aurora, NY (US)

( * ) Notice: Subject to any disclaimer, the term of this patent is extended or adjusted under 35 U.S.C. 154(b) by 214 days.

(21) Appl. No.: 18/279,426

(22) PCT Filed: Feb. 24, 2022

(86) PCT No.: PCT/US2022/017629
§ 371 (c)(1),
(2) Date: Aug. 30, 2023

(87) PCT Pub. No.: WO2022/187066
PCT Pub. Date: Sep. 9, 2022

(65) Prior Publication Data
US 2024/0196575 A1    Jun. 13, 2024

Related U.S. Application Data

(60) Provisional application No. 63/155,228, filed on Mar. 1, 2021.

(51) Int. Cl.
*H05K 7/20*         (2006.01)
(52) U.S. Cl.
CPC ..... *H05K 7/20927* (2013.01); *H05K 7/20272* (2013.01)
(58) Field of Classification Search
CPC .......... H05K 7/20927–20936; H05K 7/20272; H05K 7/20327; H05K 7/1465; H05K 7/20218; H05K 7/1471
See application file for complete search history.

(56) References Cited

U.S. PATENT DOCUMENTS

2003/0133259 A1* 7/2003 Meyer ..................... H02M 1/44
                                                    361/677
2005/0259402 A1* 11/2005 Yasui ................. H05K 7/20927
                                                    361/699

(Continued)

FOREIGN PATENT DOCUMENTS

EP         1739804 A1    1/2007
JP      2014183711 A     9/2014

(Continued)

*Primary Examiner* — Jacob R Crum
(74) *Attorney, Agent, or Firm* — Harter Secrest & Emery LLP

(57) ABSTRACT

A modular actuator control system comprising first and second actuator control modules configured to control first and second actuators and each having a housing, control and power electronics, power and communication connections, an actuator power connection, a flow path in each housing between an inlet and outlet port that is configured to provide a liquid coolant to the power electronics in the housing, an attachment connecting the first and second housings of the first and second actuator control modules, and a coolant inlet port of the first actuator control module configured to connect to a fluid coolant source and a coolant outlet port of the first actuator control module connected to a coolant inlet port of the second actuator control module, wherein the first actuator control module and the second actuator control module are stacked in coolant fluid communication with each other.

24 Claims, 12 Drawing Sheets

(56) References Cited

U.S. PATENT DOCUMENTS

| | | |
|---|---|---|
| 2008/0218966 A1 | 9/2008 | Lang et al. |
| 2008/0232065 A1 | 9/2008 | Lang et al. |
| 2012/0212907 A1* | 8/2012 | Dede ................... H01L 23/4735 |
| | | 361/689 |
| 2017/0250493 A1 | 8/2017 | Iijima et al. |
| 2018/0261527 A1* | 9/2018 | Takeuchi .............. H01L 23/427 |

FOREIGN PATENT DOCUMENTS

| | | |
|---|---|---|
| JP | 2015139356 A | 7/2015 |
| WO | 2022029177 A1 | 2/2022 |

* cited by examiner

MODULAR RUGGED COOLED ACTUATOR CONTROL SYSTEM

TECHNICAL FIELD

The present invention relates generally to actuator control systems, and more particularly to a modular actuator control system.

BACKGROUND ART

Electric motors that provide actuation in at least one motion axis are well known in the prior art and are used in a wide variety of industries. It is known that such motors can directly or indirectly drive linear or rotary actuators or may drive a pump to provide electrohydraulic linear or rotary actuation. It is also known that such actuation systems may include drive control and power electronics to control and supervise operation of the actuator.

BRIEF SUMMARY OF THE INVENTION

With parenthetical reference to the corresponding parts, portions or surfaces of the disclosed embodiment, merely for purposes of illustration and not by way of limitation, a modular actuator control system (15) is provided comprising: a first controller module (18) configured to control an electrically powered first actuator (22) having at least one motion axis; a second controller module (19) configured to control an electrically power second actuator (23) having at least one motion axis; the first controller module (18) comprising: a first housing (30a); first control electronics (32a) in the first housing (30a); first power electronics (31a) in the first housing (30a); a first power connection (36a) configured to connect to a power source (67); a first communication connection (37a) configured to connect to master controller electronics (61); a first actuator power connection (39a) configured to connect the first power electronics (31a) with the first actuator (22); a first coolant inlet port (80a, 82a); a first coolant outlet port (81a, 83a); and a first flow path (87a) in the first housing (30a) between the first coolant inlet port (80a, 82a) and the first coolant outlet port (81a, 83a) that is configured to provide a liquid coolant to the first power electronics (31a); the second controller module (19) comprising: a second housing (30b); second control electronics (32b) in the second housing (30b); second power electronics (31b) in the second housing (30b); a second power connection (36b) configured to connect to the power source (67); a second communication connection (37b) configured to connect to the master controller electronics (61); a second actuator power connection (39b) configured to connect the second power electronics (31b) with the second actuator (23); a second coolant inlet port (80b, 82b); a second coolant outlet port (81b, 83b); and a second flow path (87b) in the second housing (30b) between the second coolant inlet port (80b, 82b) and the second coolant outlet port (81b, 83b) that is configured to provide the liquid coolant to the second power electronics (31b); an attachment (28a-28d) connecting the first housing (30a) of the first controller module (18) and the second housing (30b) of the second controller module (19); the first coolant inlet port (80a, 82a) of the first controller module configured to connect to a fluid coolant source (45); and the first coolant outlet port (81a, 83a) of the first controller module (18) connected to the second coolant inlet port (80b, 82b) of the second controller module (19); wherein the first controller module (18) and the second controller module (19) are stacked in coolant fluid communication with each other.

The first controller module (18) may comprise a first secondary coolant outlet port (81a) and a first secondary flow path (85a) in the first housing (30a) between the first coolant inlet port (80a) and the first secondary coolant outlet port (81a); the first flow path (87a) may be separate from the first secondary flow path (85a); the second controller module (19) may comprise a second secondary coolant inlet port (80b); and the first secondary coolant outlet port (81a) of the first controller module (18) may be connected to the second secondary coolant inlet port (80b) of the second controller module (19); wherein the first controller module (18) and the second controller module (19) may be stacked in a parallel flow path coolant configuration (FIG. 8).

The first controller module (18) may comprise a first actuator communication connection (40a) configured to connect the first controls electronics (32a) with the first actuator (22); and the second controller module (19) may comprise a second actuator communication connection (40b) configured to connect the second controls electronics (32b) with the second actuator (23). The first actuator (22) may comprise a first sensor (43a) for sensing an operating parameter of the first actuator (22) and the first actuator communication connection (40a) may be configured to connect the first controls electronics (32a) with the first sensor (43a) of the first actuator (22); and the second actuator (23) may comprise a second sensor (43b) for sensing an operating parameter of the second actuator (23) and the second actuator communication connection (40b) may be configured to connect the second controls electronics (32b) with the second sensor (43b) of the second actuator (23).

The modular actuator control system may comprise a common power bus (50) supplying electric power to the first power connection (36a) and the second power connection (36b). The modular actuator control system may comprise a common serial bus (60a) communicating with the first communication connection (37a) and the second communication connection (37b).

The first housing (30a) may comprise a first sealed electronics housing section defining a first electronics chamber (98a) substantially isolated from an outside environment and the first control electronics (32a) and the first power electronics (31a) may be disposed in the first chamber (98a); and the second housing (30b) may comprise a second sealed electronics housing section defining a second electronics chamber (98b) substantially isolated from the outside environment and the second control electronics (32b) and the second power electronics (31b) may be disposed in the second chamber (98b). The first housing (30a) may comprise a first connection section defining a first connection chamber (99a) substantially isolated from the outside environment and the first power connection (36a) and the first communication connection (37a) may be disposed in the first connection chamber (99a); and the second housing (30b) may comprise a second connection section defining a second connection chamber (99b) substantially isolated from the outside environment and the second power connection (36b) and the second communication connection (37b) may be disposed in the second connection chamber (99b). The modular actuator control system may comprise a power bus (50) supplying electric power to the first power connection (36a) and the second power connection (36b); and a serial bus (60a) communicating with the first communication connection (37a) and the second communication connection (37b); and the common power bus (50) may extend into the first connection chamber (99a) and the second connection chamber (99b); and the common serial bus (60a) may extend into the first connection chamber (99a) and the second connection chamber (99b).

The modular actuator control system may comprise a master controller module (16) comprising: a master controller housing (30f); the master controller electronics (61) disposed in the master controller housing (30f); a master communication connection (37f) configured to connect to the first communication connection (37a) of the first controller module (18) and the second communication connection (37b) of the second controller module (19); and the attachment (28a-28d) connecting the first housing (30a) of the first controller module (18), the second housing (30b) of the second controller module (19), and the master controller housing (30f) of the master controller module (16). The modular actuator control system may comprise a serial bus (60a) communicating between the master communication connection (37f), the first communication connection (37a) and the second communication connection (37b).

The modular actuator control system may comprise a power management module (17) comprising: a power management housing (30e); power management electronics (51) in the power management housing (30e); an input power connection (66) configured to connect to the power source (67); an output control power connection (37e) configured to connect to the first control electronics (32a) and the second control electronics (32b); a power coolant inlet port (80e, 82e); a power coolant outlet port (81e, 83e); and a power flow path (87e) in the power management housing (30e) between the power coolant inlet port (80e, 82e) and the power coolant outlet port (81e, 83e) that is configured to provide a liquid coolant to the power management electronics (51); and the attachment (28a-28d) connecting the first housing (30a) of the first controller module (18), the second housing (30b) of the second controller module (19), the master controller housing (30f) of the master controller module (16), and the power management housing (30e) of the power management module (17). The master controller module (16) may comprise an input control power connection (37f) configured to connect to the output control power connection (37e) of the power management module (17).

The modular actuator control system may comprise a pump (45) connected to the first coolant inlet port (80a, 82a) of the first controller module (18) and operatively configured to pump the liquid coolant through the first flow path (87a) of the first housing (30a) and the second flow path (87b) of the second housing (30b). The modular actuator control system may comprise a heat exchanger (46) connected between the second coolant outlet port (81b, 83b) of the second controller module (19) and the first coolant inlet port (80a, 82a) of the first controller module (18). The heat exchanger (46) may be connected between the second coolant outlet port (81b, 83b) of the second controller module (19) and the pump (45). The modular actuator control system may comprise a seal between the first housing (30a) of the first controller module (18) and the second housing (30b) of the second controller module (19).

The power management module (17) may be stacked between the second controller module (19) and the master controller module (16) and the second coolant outlet port (81b, 83b) of the second controller module (19) may be connected to the power coolant inlet port (80e, 82e) of the power management module (17). The modular actuator control system may comprise: a third controller module (20, 21) configured to control an electrically power third actuator (24, 25, 26, 27) having at least one motion axis; the third controller module (20, 21) comprising: a third housing (30c, 30d); third control electronics (32c, 32d) in the third housing (30c, 30d); third power electronics (31c, 31d, 31e, 31f) in the third housing (30c, 30d); a third power connection (36c, 36d) configured to connect to the power source (67); a third communication connection (37c, 37d) configured to connect to the master controller electronics (61); a third actuator power connection (39c, 39d, 39e, 39f) configured to connect the third power electronics (31c, 31d, 31e, 31f) with the third actuator (24, 25, 26, 27); a third coolant inlet port (80c, 80d, 82c, 82d); a third coolant outlet port (81c, 81d, 83c, 83d); and a third flow path (87c, 87d) in the third housing (30c, 30d) between the third coolant inlet port (80c, 80d, 82c, 82d) and the third coolant outlet port (81c, 81d, 83c, 83d) that is configured to provide the liquid coolant to the third power electronics (31c, 31d, 31e, 31f); the attachment (28a-28d) connecting the first housing (30a) of the first controller module (18), the second housing (30b) of the second controller module (19), and the third housing (30c, 30d) of the third controller module (20, 21); and the second coolant outlet port (81b, 83b) of the second controller module (19) connected to the third coolant inlet port (80c, 80d, 82c, 82d) of the third controller module (20, 21); wherein the first controller module (18), the second controller module (19), and the third controller module (20, 21) are stacked in coolant fluid communication with each other. The second controller module (19) may comprise a second secondary coolant outlet port (83b) and a second secondary flow path (86b) in the second housing (30b) between the second coolant inlet port (82b) and the second secondary coolant outlet port (83b); the second flow path (87b) may be separate from the second secondary flow path (86b); the third controller module (21) may comprise a third secondary coolant inlet port (82d); and the second secondary coolant outlet port (83b) of the second controller module (19) may be connected to the third secondary coolant inlet port (82d) of the third controller module (21); wherein the first controller module (18) and the second controller module (19) may be stacked in a series flow path coolant configuration and the second controller module (19) and the third controller module (21) may be stacked in a parallel flow path coolant configuration.

The first flow path (87a, 287) in the first housing (30a) between the first coolant inlet port (82a, 282) and the first coolant outlet port (81a) may comprise a plurality of separate coolant passages (90, 290) in thermal proximity to the first power electronics (31a). The first flow path (187) in the first housing (30a) between the first coolant inlet port (180) and the first coolant outlet port may comprise a serpentine coolant passage in thermal proximity to the first power electronics (31a).

The master controller housing (30f) of the master controller module (16) may contain a braking resistor (53) and a DC capacitor (54). The power source (67) may comprise an electric-vehicle battery.

DETAILED DESCRIPTION OF THE EMBODIMENTS

Figure 1:
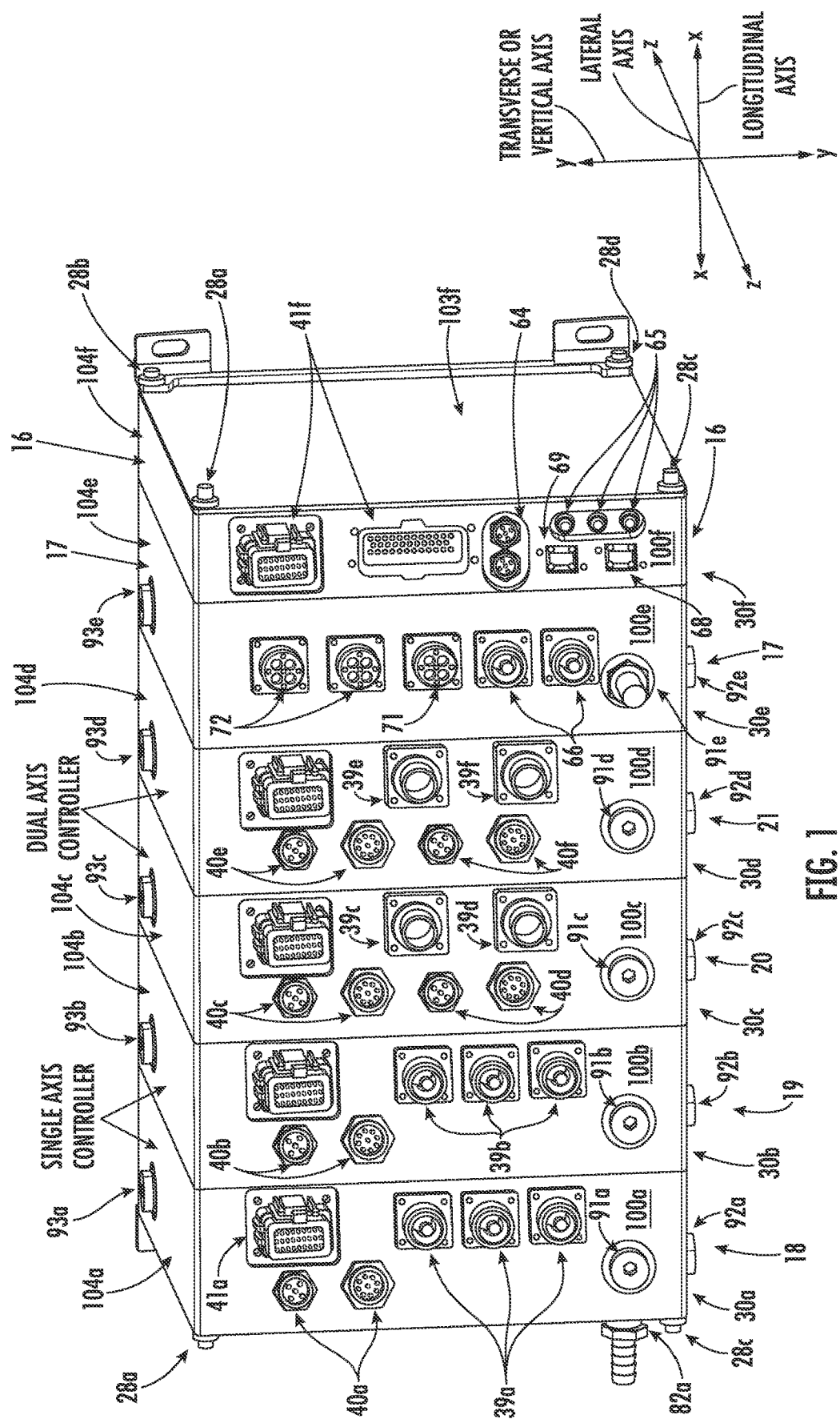
FIG. 1 is a front isometric view of an embodiment of an improved modular actuator control system.
Figure 2:
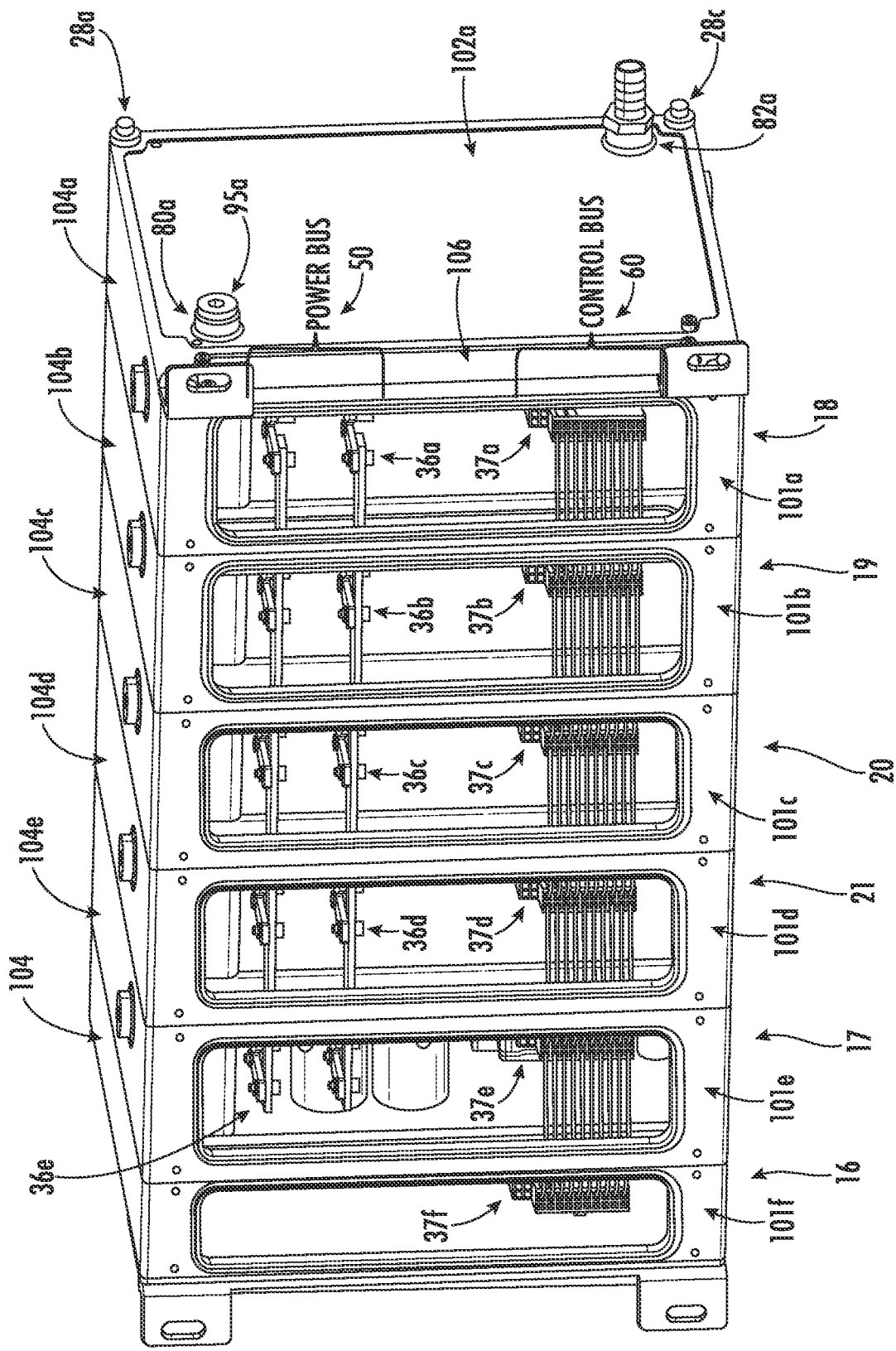
FIG. 2 is a rear isometric view of the modular actuator control system shown in FIG. 1.
Figure 3:
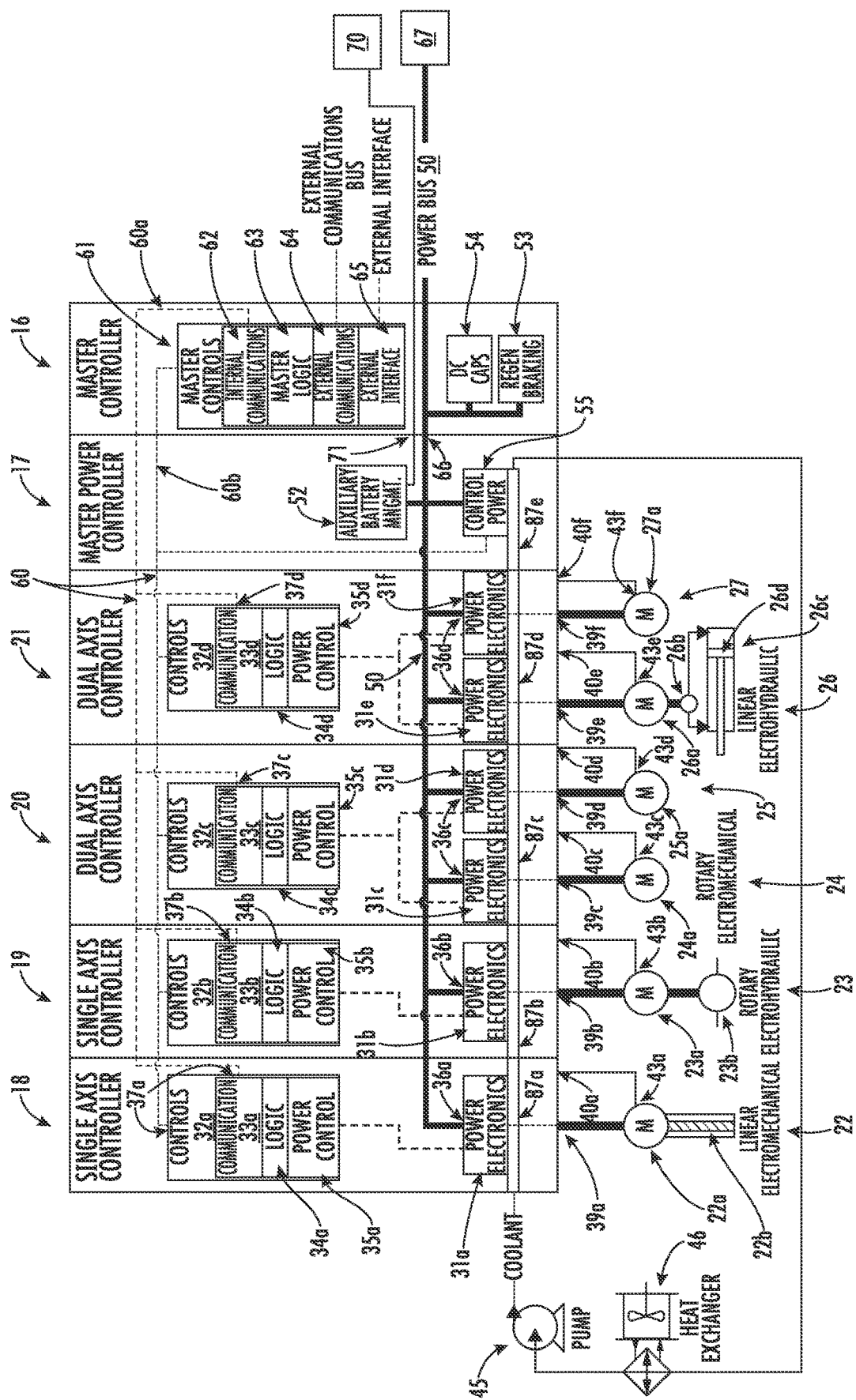
FIG. 3 is a schematic view of the modular actuator control system shown in FIG. 1 operationally coupled to an example liquid cooling system and multiple example actuators.
Figure 4:
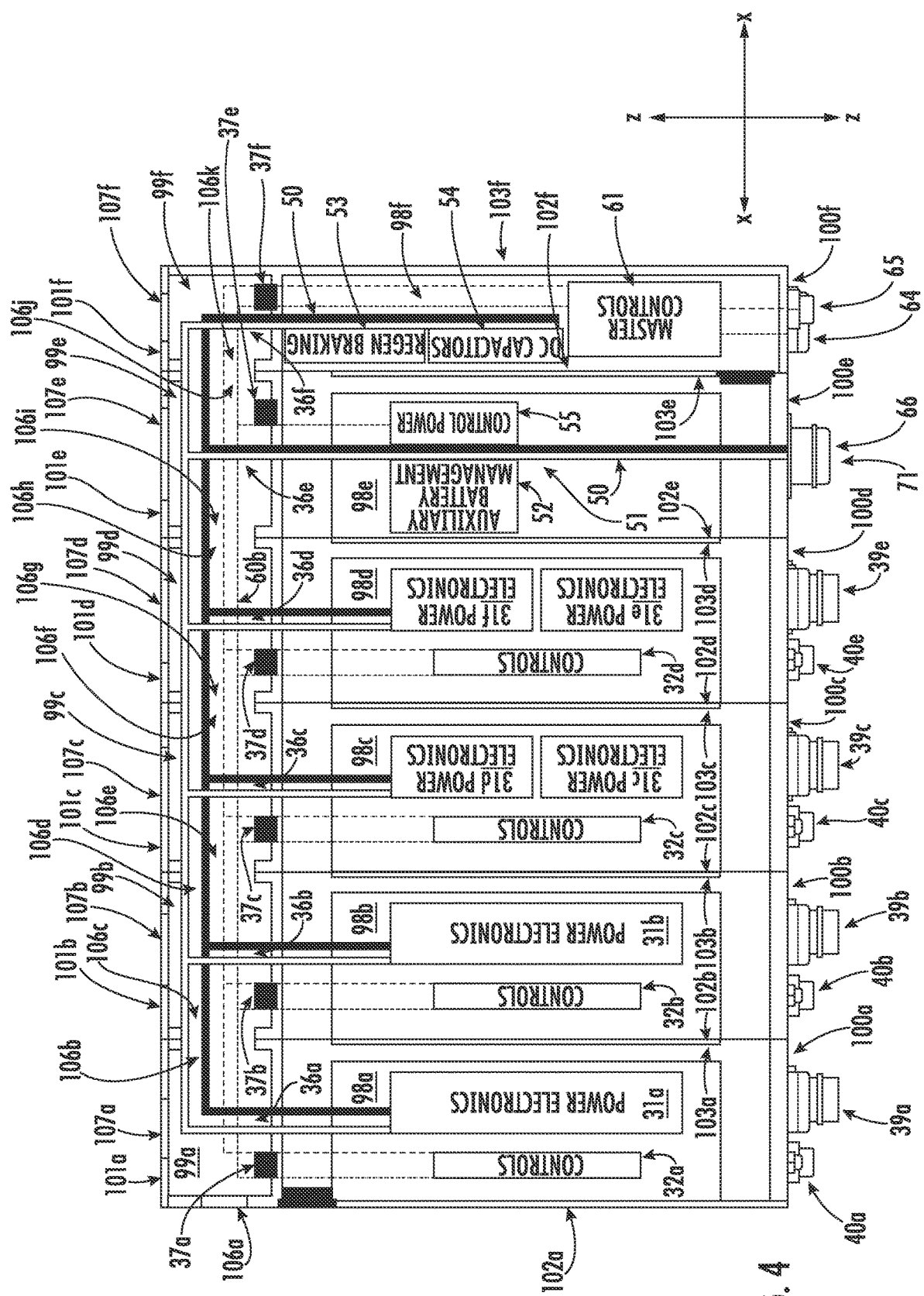
FIG. 4 is a top plan schematic view of the modular actuator control system shown in FIG. 1.
Figure 5:
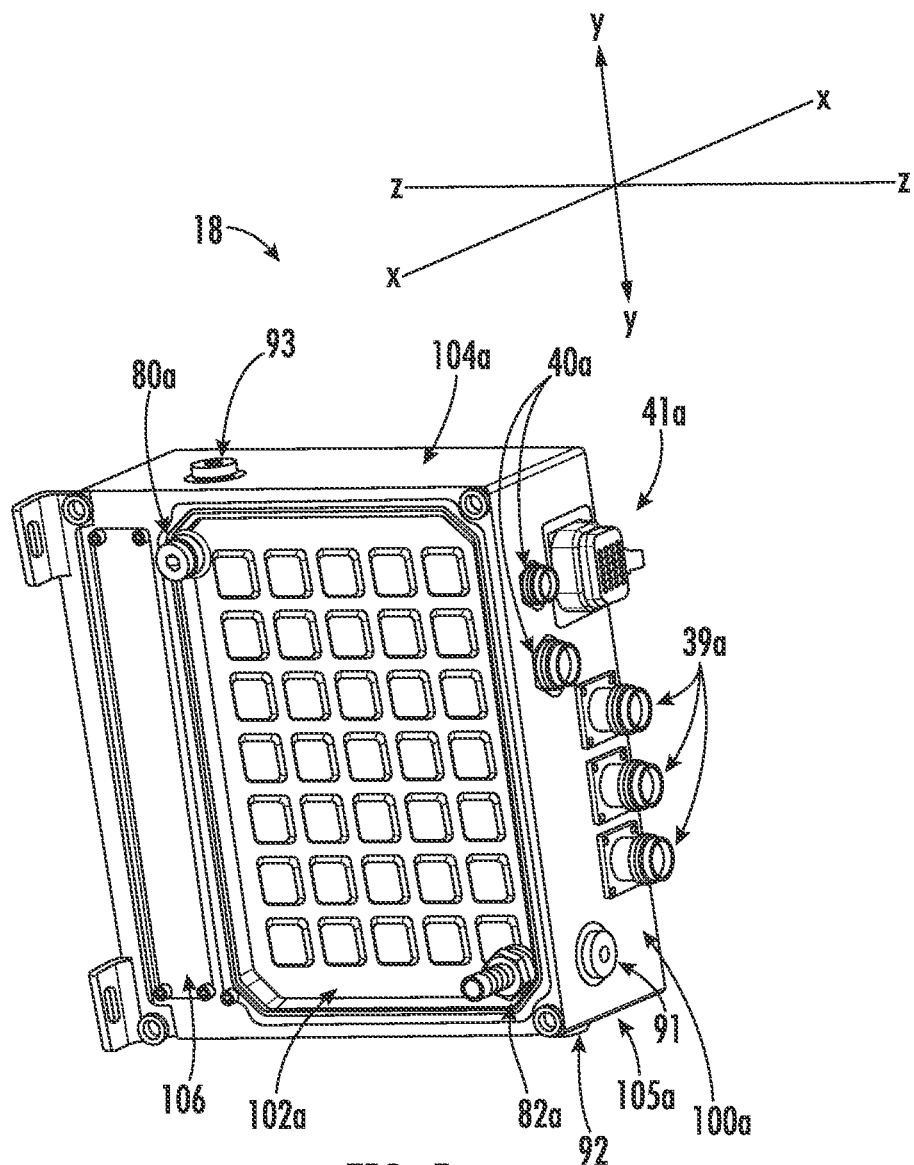
FIG. 5 is a left side isometric view of the left actuator control module shown in FIG. 1.

At the outset, it should be clearly understood that like reference numerals are intended to identify the same structural elements, portions or surfaces consistently throughout the several drawing figures, as such elements, portions or surfaces may be further described or explained by the entire written specification, of which this detailed description is an integral part. Unless otherwise indicated, the drawings are intended to be read (e.g., crosshatching, arrangement of parts, proportion, degree, etc.) together with the specification, and are to be considered a portion of the entire written description of this invention. As used in the following description, the terms "horizontal", "vertical", "left", "right", "up" and "down", as well as adjectival and adverbial derivatives thereof (e.g., "horizontally", "rightwardly", "upwardly", etc.), simply refer to the orientation of the illustrated structure as the particular drawing figure faces the reader. Similarly, the terms "inwardly" and "outwardly" generally refer to the orientation of a surface relative to its axis of elongation, or axis of rotation, as appropriate.

Referring now to the drawings, and more particularly to FIGS. 1-4, a modular actuator control system is provided, a first embodiment of which is generally indicated at 15. As shown, system 15 comprises central control module 16, central power module 17, first actuator control module 18, second actuator control module 19, third actuator control module 20, and fourth actuator control module 21, which are all stacked together to provide compact, rugged, and cooled controller system 15 for controlling a plurality of actuators 22-27.

As shown, first actuator control module 18 controls linear electromechanical actuator 22, second actuator control module 19 controls rotary electrohydraulic actuator 23, third actuator control module 20, which is a dual drive controller, controls both rotary electromechanical actuator 24 and rotary electromechanical actuator 25, and fourth actuator control module 21, which is a dual drive controller, controls both linear electrohydraulic actuator 26 and rotary electromechanical actuator 27. While this embodiment includes four actuator control modules 18-21 that control six actuators 22-27, other configurations may be employed depending on the desired application. For example, and without limitation, less than four or more than four actuator control modules may be stacked together as desired. In addition, and without limitation, the actuator control modules may be configured to control alternative types of actuators. Thus, the modular system is easily adaptable and expandable and may comprise different stacked actuator control modules depending on the desired actuator count and functionality.

As shown in FIGS. 1-4, in this embodiment actuator control module 18 is a single axis controller and generally comprises housing 30*a* containing power electronics 31*a*, controller electronics 32*a* and interior coolant conduit 87*a* in a front portion, and containing actuator power connection 36*a* operatively connected to DC bus 50 and communication connection 37*a* operatively connected to communications and control power bus 60*a* and 60*b* in a rear portion.

As shown, housing 30*a* is a sturdy enclosure generally comprising front panel 100*a*, left side panel 102*a* with back-end opening cover 106*a*, right side panel 103*a* with back end opening 106*b*, bottom panel 105*a*, top panel 104*a*, and rear panel 101*a* with rear opening cover 107*a*. As mentioned above, housing 30*a* generally comprises front compartment 98*a*, which generally houses control electronics 32*a*, power electronics 31*a* and interior cooling conduit 87*a*, and rear compartment 99*a*, which generally houses the connectivity to the other modules. The front and rear compartments 98 and 99 are separated by an interior panel with properly sized openings for power and communication bus connections. The housing panels are punctured by various connections and by various opening that may be plugged when not used. As shown in FIG. 1, front panel 100*a* of housing 30*a* includes actuator power connections 39*a*, actuator sensor feedback connections 40*a*, and in this embodiment auxiliary interface 41*a*. Actuator power connection 39*a* provides driving power to actuator 22. Actuator sensor feedback connection 40*a* interfaces with the feedback sensors 43*a* of actuator 22. Auxiliary interface 41*a* allows for the connection of module 18 to other external auxiliary sensors and functions if desired. Housing 30*a* of module 18 protects the internal electronics from the outside environment when stacked with modules 16, 17 and 19-21 as shown. While in this embodiment rear panel 101*a* is shown with a rear access opening that is covered by rear opening cover 107*a* after assembly of the modular stack, alternatively and without limitation rear panel 101*a* may be a solid panel.

As shown, power electronics 31*a* provide operational power to the terminals of electric motor 22*a* via actuator power connection 39*a*. Power electronics 31*a* converts DC power from connection 36*a* to DC bus 50 into a controlled Pulse Width Modulated (PWM) current which drives motor 22*a*. The operation of power electronics 31*a* is governed by PWM control signals from power control interface 35*a* of motor control electronics 32*a*.

Motor control electronics 32*a* control, monitor and supervise operation of actuator 22, including the control of power to motor 22*a* via power control interface 35*a*. Motor control electronics 32*a* include communication interface 33*a*, processor 34*a*, and power control interface 35*a*. Communication interface 33*a* provides communications with central control module 16 and if desired other actuator control modules 19, 20 and 21 via communication connection 37*a*. Communication interface 33*a* communicates data, commands and states. Processor 34*a* provides internal control and monitoring. Processor 34*a* receives commands from central controller module 16 and feedback from sensors 43*a* recording operating parameters of actuator 22, via actuator sensor connection 40a, and controls actuator 22 accordingly. In this embodiment, such sensors are coupled to control electronics 32a via wired connection 40a. In other embodiments, they may be coupled via a wireless connection. Processor 34a is configured to perform a variety of computer-implemented functions such as performing method steps, calculations and the like and storing relevant data. Processor 34a may be any digital device which has output lines that are a logic function of its input lines, examples of which include a microprocessor, microcontroller, field programmable gate array (FPGA), programmable logic device (PLD), application specific integrated circuit, or other similar devices.

In this embodiment, actuator 22 is a linear electromechanical actuator having three-phase permanent magnet DC electric motor 22a driving output shaft 22b. Linear magnetic motor 22a includes a stationary stator and a sliding shaft that is driven to move linearly (that is, as a straight line translation) with respect to the stator. The shaft is at least partially surrounded by the stator and is held in place relative to the stator by a bearing. The shaft generates a magnetic field by virtue of having a series of built in permanent magnets. The stator generates magnetic fields through annular magnetic coils. By timing the flow of current in the coils with respect to the position and/or momentum of the shaft, the interaction of magnetic forces from the shaft and from the stator will actuate the shaft to move linearly in either direction. Other motors may also be used as alternatives. A position sensor 43a provides position feedback, via connection 40a, to monitor shaft position which is used for closed loop motion control in motor control electronics 32a. A position sensor may be any electrical device for measuring the position, or a derivative of position, or distance from an object, examples of which include an encoder, a resolver, a linear variable differential transformer, a variable resistor, a variable capacitor, a laser rangefinder, an ultrasonic range detector, an infrared range detector, or other similar devices.

As shown in FIGS. 1-4, in this embodiment actuator control module 19 is a single axis controller and, similar to module 18, generally comprises housing 30b containing power electronics 31b, controller electronics 32b, and interior coolant conduit 87b in a front portion and containing actuator power connection 36b operatively connected to DC bus 50 and communication connection 37b operatively connected to communication and control power bus 60 in a rear portion.

As shown, housing 30b is a sturdy enclosure generally comprising front panel 100b, left side panel 102b with back-end opening 106c aligned with back end opening 106b in right side panel 103a of module 18, right side panel 103b with back end opening 106d, bottom panel 105b, top panel 104b, and rear panel 101b with rear opening cover 107b. As mentioned above, housing 30b generally comprises front compartment 98b, which generally houses control electronics 32b, power electronics 31b and interior cooling conduit 87b, and rear compartment 99b, which generally houses the connectivity to the other modules. The front and rear compartments 98b and 99b are separated by an interior panel with properly sized openings for power and communication bus connections. The housing panels are punctured by various connections and by various opening that may be plugged when not used. As shown in FIG. 1, front panel 100b of housing 30b includes actuator power connections 39b, actuator sensor feedback connections 40b, and in this embodiment auxiliary interface 41b. Actuator power connection 39b provides driving power to actuator 23. Actuator sensor feedback connection 40b interfaces with the feedback sensors 43b of actuator 23. Auxiliary interface 41b allows for the connection of module 19 to other external auxiliary sensors and functions if desired. Housing 30b of module 19 protects the internal electronics from the outside environment when stacked with modules 16, 17, 18 and, 20 and 21 as shown. While in this embodiment rear panel 101b is shown with a rear access opening that is covered by rear opening cover 107b after assembly of the modular stack, alternatively and without limitation rear panel 101b may be a solid panel.

As shown, power electronics 31b provide operational power to the terminals of electric motor 23a via actuator power connection 39b. Power electronics 31b converts DC power from connection 36b to DC bus 50 into a controlled PWM current which drives motor 23a. The operation of power electronics 31b is governed by PWM control signals from power control interface 35b of motor control electronics 32b.

Motor control electronics 32b control, monitor and supervise operation of actuator 23, including the control of power to motor 23a via power control interface 35b. Motor control electronics 32b include communication interface 33b, processor 34b, and power control interface 35b. Communication interface 33b provides communications with central control module 16 and if desired other actuator control modules 18, 20 and 21 via communication connection 37b. Communication interface 33b communicates data, commands and states. Processor 34b provides internal control and monitoring. Processor 34b receives commands from central controller module 16 and feedback from sensors 43b recording operating parameters of actuator 23, via actuator sensor connection 40b, and controls actuator 23 accordingly. In this embodiment, such sensors are coupled to control electronics 32a via wired connection 40a.

In this embodiment, actuator 23 is a rotary electrohydraulic actuator generally comprising variable speed bidirectional electric servomotor 23a and bi-directional or reversible pump 23b driven by motor 23a. In this embodiment motor 23a is a brushless D.C. variable-speed servo-motor that is supplied with a current. Motor 23a has an inner rotor with permanent magnets and a fixed non-rotating stator with coil windings. When current is appropriately applied through the coils of the stator via power electronics 31b and power connection 39b, a magnetic field is induced. The magnetic field interaction between the stator and the rotor generates torque which may rotate the output shaft of motor 23a. Control electronics 32b, based on position feedback via connection 40b, generate and commutate the stator fields via power electronics 31b to vary the speed and direction of motor 23a. Accordingly, motor 23a will selectively apply a torque on its output shaft in either direction about the output shaft axis at varying speeds. Other motors may be used as alternatives. For example, a variable speed stepper motor, brush motor or induction motor may be used. In this embodiment pump 23b is a fixed displacement bi-directional internal two-port gear pump. The pumping elements, namely intermeshed gears, are capable of rotating in either direction, thereby allowing hydraulic fluid to flow in either direction. This allows for oil to be added into and out of the system as controller 32b closes the control loop of position or pressure. At least one gear of pump 23b is connected to the output shaft of motor 23a, with the other pump gear following. The direction of flow of pump 23b depends on the direction of rotation of the rotor and the output shaft of motor 23a. The speed and output of pump 23b is variable with variations in the speed of motor 23a. Other bi-directional pumps may be used as alternatives. For example, a variable displacement pump may be used.

As shown in FIGS. 1-4, in this embodiment actuator control module 20 is a dual axis controller and generally comprises housing 30c containing power electronics 31c, power electronics 31d, controller electronics 32c, and interior coolant conduit 87c in a front portion and containing actuator power connection 36c operatively connected to DC bus 50 and communication connection 37c operatively connected to communication and control power bus 60 in a rear portion.

As shown, housing 30c is a sturdy enclosure generally comprising front panel 100c, left side panel 102c with back-end opening 106e aligned with back end opening 106d in right side panel 103b of module 19, right side panel 103c with back end opening 106f, bottom panel 105c, top panel 104c, and rear panel 101c with rear opening cover 107c. As mentioned above, housing 30c generally comprises front compartment 98c, which generally houses control electronics 32c, power electronics 31c, power electronics 31d, and interior cooling conduit 87c, and rear compartment 99c, which generally houses the connectivity to the other modules. The front and rear compartments 98c and 99c are separated by an interior panel with properly sized openings for power and communication bus connections. The housing panels are punctured by various connections and by various opening that may be plugged when not used. As shown in FIG. 1, front panel 100c of housing 30c includes first actuator power connection 39c, second actuator power connection 39d, first actuator sensor feedback connection 40c, second actuator sensor feedback connection 40d, and in this embodiment auxiliary interface 41c. Actuator power connection 39c provides driving power to actuator 24. Actuator sensor feedback connection 40c interfaces with the feedback sensors 43c of actuator 24. Actuator power connection 39d provides driving power to actuator 25. Actuator sensor feedback connection 40d interfaces with the feedback sensors 43d of actuator 25. Auxiliary interface 41c allows for the connection of module 20 to other external auxiliary sensors and functions if desired. Housing 30c of module 20 protects the internal electronics from the outside environment when stacked with modules 16, 17, 18, 19 and 21 as shown. While in this embodiment rear panel 101c is shown with a rear access opening that is covered by rear opening cover 107c after assembly of the modular stack, alternatively and without limitation rear panel 100c may be a solid panel.

As shown, power electronics 31c provide operational power to the terminals of electric motor 24a via actuator power connection 39c. Power electronics 31c converts DC power from connection 36c to DC bus 50 into a controlled PWM current which drives motor 24a. The operation of power electronics 31c is governed by PWM control signals from power control interface 35c of motor control electronics 32c. As shown, power electronics 31d provide operational power to the terminals of electric motor 25a via actuator power connection 39d. Power electronics 31d converts DC power from connection 36c to DC bus 50 into a controlled PWM current which drives motor 25a. The operation of power electronics 31d is governed by PWM control signals from power control interface 35c of motor control electronics 32c.

Motor control electronics 32c control, monitor and supervise operation of actuator 24 and actuator 25, including the control of power to motor 24a via power control interface 35c and control of power to motor 25a via power control interface 35c. Motor control electronics 32c include communication interface 33c, processor 34c, and power control interface 35c. Communication interface 33c provides communications with central control module 16 and if desired other actuator control modules 18, 19, and 21 via communication connection 37c. Communication interface 33c communicates data, commands and states. Processor 34c provides internal control and monitoring. Processor 34c receives commands from central controller module 16 and feedback from sensors 43c recording operating parameters of actuator 24, via actuator sensor connection 40c, and controls actuator 24 accordingly. Processor 34c also receives commands from central controller module 16 and feedback from sensors 43d recording operating parameters of actuator 25, via actuator sensor connection 40d, and controls actuator 25 accordingly.

In this embodiment, actuators 24 and 25 are rotary electromechanical actuators generally comprising variable speed bidirectional electric servomotors 24a and 25a, respectively. In this embodiment motors 24a and 25a are brushless D.C. variable-speed servo-motors with electronically controlled commutation systems that are supplied with a current and include resolver feedback to monitor rotor angle which is used for closed loop motion control in actuator control electronics 32c. Motor 24a has an inner rotor with permanent magnets and a fixed non-rotating stator with coil windings. When current is appropriately applied through the coils of the stator via power electronics 31c and power connection 39c, a magnetic field is induced. The magnetic field interaction between the stator and the rotor generates torque which may rotate the output shaft of motor 24a. Control electronics 32c, based on position feedback via connection 40c, generate and commutate the stator fields via power electronics 31c to vary the speed and direction of motor 24a. Similarly, motor 25a has an inner rotor with permanent magnets and a fixed non-rotating stator with coil windings. When current is appropriately applied through the coils of the stator via power electronics 31d and power connection 39d, a magnetic field is induced. The magnetic field interaction between the stator and the rotor generates torque which may rotate the output shaft of motor 25a. Control electronics 32c, based on position feedback via connection 40d, generate and commutate the stator fields via power electronics 31d to vary the speed and direction of motor 25a. Accordingly, motors 24a and 25a will each selectively apply a torque on its output shaft in either direction about the output shaft axis at varying speeds. Other motors may be used as alternatives. For example, a variable speed stepper motor, brush motor or induction motor may be used.

As shown in FIGS. 1-4, in this embodiment actuator control module 21 is a dual axis controller and, similar to module 20, general comprises housing 30d containing power electronics 31e, power electronics 31f, controller electronics 32d, and interior coolant conduit 87d in a front portion and containing actuator power connection 36d operatively connected to DC bus 50 and communication connection 37d operatively connected to communication and control power bus 60 in a rear portion.

As shown, housing 30d is a sturdy enclosure generally comprising front panel 100d, left side panel 102d with back-end opening 106g aligned with back end opening 106f in right side panel 103c of module 20, right side panel 103d with back end opening 106h, bottom panel 105d, top panel 104d, and rear panel 101d with rear opening cover 107d. As mentioned above, housing 30d generally comprises front compartment 98d, which generally houses control electronics 32d, power electronics 31e, power electronics 31f, and interior cooling conduit 87d, and rear compartment 99d, which generally houses the connectivity to the other modules. The front and rear compartments 98d and 99d are separated by an interior panel with properly sized openings for power and communication bus connections. The housing panels are punctured by various connections and by various opening that may be plugged when not used. As shown in FIG. 1, front panel 100d of housing 30d includes first actuator power connection 39e, second actuator power connection 39f, first actuator sensor feedback connection 40e, second actuator sensor feedback connection 40f, and in this embodiment auxiliary interface 41d. Actuator power connection 39e provides driving power to actuator 26. Actuator sensor feedback connection 40e interfaces with the feedback sensors 43e of actuator 26. Actuator power connection 39f provides driving power to actuator 27. Actuator sensor feedback connection 40f interfaces with the feedback sensors 43f of actuator 27. Auxiliary interface 41d allows for the connection of module 21 to other external auxiliary sensors and functions if desired. Housing 30d of module 21 protects the internal electronics from the outside environment when stacked with modules 16, 17, 18, 19 and 20 as shown. While in this embodiment rear panel 101d is shown with a rear access opening that is covered by rear opening cover 107d after assembly of the modular stack, alternatively and without limitation rear panel 101d may be a solid panel.

As shown, power electronics 31e provide operational power to the terminals of electric motor 26a via actuator power connection 39e. Power electronics 31e converts DC power from connection 36d to DC bus 50 into a controlled PWM current which drives motor 26a. The operation of power electronics 31e is governed by PWM control signals from power control interface 35d of motor control electronics 32d. As shown, power electronics 31f provide operational power to the terminals of electric motor 27a via actuator power connection 39f. Power electronics 31f converts DC power from connection 36d to DC bus 50 into a controlled PWM current which drives motor 27a. The operation of power electronics 31f is governed by PWM control signals from power control interface 35d of motor control electronics 32d.

Motor control electronics 32d control, monitor and supervise operation of actuator 26 and actuator 27, including the control of power to motor 26a via power control interface 35d and control of power to motor 27a via power control interface 35d. Motor control electronics 32d include communication interface 33d, processor 34d, and power control interface 35d. Communication interface 33d provides communications with central control module 16 and if desired other actuator control modules 18, 19, and 20 via communication connection 37d. Communication interface 33d communicates data, commands and states. Processor 34d provides internal control and monitoring. Processor 34d receives commands from central controller module 16 and feedback from sensors 43e recording operating parameters of actuator 26, via actuator sensor connection 40e, and controls actuator 26 accordingly. Processor 34d also receives commands from central controller module 16 and feedback from sensors 43f recording operating parameters of actuator 27, via actuator sensor connection 40f, and controls actuator 27 accordingly.

In this embodiment, actuator 26 is a linear electrohydraulic actuator having electric motor 26a driving hydraulic pump 26b in a closed loop hydraulic circuit to extend and retract hydraulic cylinder driving mechanism 26c. In this embodiment, servo-motor 26a is used to drive reversible pump 26b to extend and retract piston 26d in cylinder 26c, with pump 26b pressurizing a working fluid, typically hydraulic oil, directly raising the pressure in a hydraulic gap on one side or the other of hydraulic piston 26d. In this embodiment motor 26a is a brushless D.C. variable-speed servo-motor that is supplied with a current. Motor 26a has an inner rotor with permanent magnets and a fixed non-rotating stator with coil windings. When current is appropriately applied through the coils of the stator via power electronics 31e and power connection 39e, a magnetic field is induced. The magnetic field interaction between the stator and the rotor generates torque which may rotate the output shaft of motor 26a. Control electronics 32d, based on position feedback via connection 40e, generate and commutate the stator fields via power electronics 31e to vary the speed and direction of motor 26a. Accordingly, motor 26a will selectively apply a torque on its output shaft in either direction about the output shaft axis at varying speeds. In this embodiment pump 26b is a fixed displacement bi-directional internal two-port gear pump. The pumping elements, namely intermeshed gears, are capable of rotating in either direction, thereby allowing hydraulic fluid to flow in either direction. This allows for oil to be added into and out of the system as controller 32d closes the control loop of position or pressure. At least one gear of pump 26b is connected to the output shaft of motor 26a, with the other pump gear following. The direction of flow of pump 26b depends on the direction of rotation of the rotor and the output shaft of motor 26a. The speed and output of pump 26b is variable with variations in the speed of motor 26a.

In this embodiment, actuator 27 is a rotary electromechanical actuator generally comprising variable speed bidirectional electric servomotor 27a. In this embodiment motor 27a is a brushless D.C. variable-speed servo-motors with an electronically controlled commutation system that is supplied with a current and includes resolver feedback to monitor rotor angle which is used for closed loop motion control in actuator control electronics 32d. Motor 27a has an inner rotor with permanent magnets and a fixed non-rotating stator with coil windings. When current is appropriately applied through the coils of the stator via power electronics 31f and power connection 39f, a magnetic field is induced. The magnetic field interaction between the stator and the rotor generates torque which may rotate the output shaft of motor 27a. Control electronics 32d, based on position feedback via connection 40f, generate and commutate the stator fields via power electronics 31f to vary the speed and direction of motor 27a. Accordingly, motor 27a will selectively apply a torque on its output shaft in either direction about the output shaft axis at varying speeds.

As shown in FIGS. 1-4, in this embodiment central power management module 17 generally comprises housing 30e containing control power electronics 55, auxiliary battery electronics 52, and interior coolant conduit 87e in a front portion, and containing actuator supply power connection 36e operatively connected to DC bus 50 and control power connection 37e operatively connected to control power bus 60b in a rear portion.

As shown, housing 30e is a sturdy enclosure generally comprising front panel 100e, left side panel 102e with back-end opening 106i aligned with back end opening 106h in right side panel 103d of module 21, right side panel 103e with back end opening 106j, bottom panel 105e, top panel 104e, and rear panel 101e with rear opening cover 107e. As mentioned above, housing 30e generally comprises front compartment 98e, which generally houses control power electronics 55, auxiliary battery electronics 52, and interior coolant conduit 87e, and rear compartment 99e, which generally houses the connectivity to the other modules. The front and rear compartments 98e and 99e are separated by interior panel 58 with properly sized openings for power and control bus connections. The housing panels are punctured by various connections and by various opening that may be plugged when not used. As shown in FIG. 1, front panel 100e of housing 30e includes DC bus power input connection 66, auxiliary battery connection 71, and in this embodiment auxiliary low power connection 72. DC bus power input connection 66 is configured to connect to power source 67, which in this embodiment comprises an electric vehicle main battery pack. Auxiliary battery connection 71 is configured to connect to auxiliary battery 70, which in this embodiment comprises a lower voltage battery, such as for example a 12 volt battery. Low power connection 72 allows for the connection of module 17 to other external low voltage devices if desired. Housing 30e of module 17 protects the internal electronics from the outside environment when stacked with modules 16, and 18-21 as shown. While in this embodiment rear panel 101e is shown with a rear access opening that is covered by rear opening cover 107e after assembly of the modular stack, alternatively and without limitation rear panel 101e may be a solid panel.

As shown, control power electronics 55 provide lower voltage operational power, via connection 37e and control power bus 60b, to actuator control electronics 32a, 32b, 32c and 32d of modules 18, 19, 20 and 21, and master control electronics 61 of module 16. Auxiliary battery electronics 52 are connected to external auxiliary battery 70 via auxiliary battery connection 71 to power the system logic prior to main power source 67 being active.

As shown in FIGS. 1-4, in this embodiment central control module 16 general comprises housing 30f containing master control electronics 61, regenerative braking electronics 53 and DC capacitor 54 in a front portion and containing power connection 36f operatively connected to DC bus 50 and communication connection 37f operatively connected to communication and control power bus 60a and 60b in a rear portion.

As shown, housing 30f is a sturdy enclosure generally comprising front panel 100f, left side panel 102f with back-end opening 106k aligned with back end opening 106j in right side panel 103e of module 17, right side panel 103f, bottom panel 105f, top panel 104f, and rear panel 101f with rear opening cover 107f. As mentioned above, housing 30f generally comprises front compartment 98f, which generally houses master control electronics 61, regenerative braking electronics 53 and DC capacitor 54, and rear compartment 99f, which generally houses the connectivity to the other modules. The front and rear compartments 98f and 99f are separated by an interior panel with properly sized openings for power and communication bus connections. The housing panels are punctured by various connections and by various opening that may be plugged when not used. As shown in FIG. 1, front panel 100f of housing 30f includes external hardwired communication bus connection 64, external wireless antenna interface 65, USB port 68, ethernet port 69, and in this embodiment auxiliary interfaces 41f. Housing 30f of module 16 protects the internal electronics from the outside environment when stacked with modules 17-21 as shown. While in this embodiment rear panel 101f is shown with a rear access opening that is covered by rear opening cover 107f after assembly of the modular stack, alternatively and without limitation rear panel 101f may be a solid panel.

DC capacitor 54 smooths out power on common bus 50 from electronic high frequency switching and braking resistor 53 dissipates regenerative power from actuators 22-27.

Master control electronics 361 control, monitor and supervise operation of individual actuator control modules 18-21. Central control electronics 61 include internal communication interface 62, master processor 63, external wired communication interface 64 and external wireless interface 65. Communication interface 62 provides communications with each of actuator control modules 18-21 via communication connection 37f. Communication interface 32 communicates data, commands and states. Processor 63 provides control and monitoring of modules 18-21. Processor 63 receives commands and input via external communication interface 64 and feedback from modules 18-21, via communication bus 60a, and provides command signals and controls modules 18-21, via communication bus 60a, accordingly. Processor 61 is configured to perform a variety of computer-implemented functions such as performing method steps, calculations and the like and storing relevant data. Processor 61 may be any digital device which has output lines that are a logic function of its input lines, examples of which include a microprocessor, microcontroller, FPGA, PLD, application specific integrated circuit, or other similar devices.

As shown, each of the four corners of housings 30a-30f includes a longitudinally extending corner through-passage sized to receive four longitudinally extending tie rods 28a, 28b, 28c and 28d, respectively, therethrough. As shown. full assembly is completed aligning the four longitudinally extending corner through-passages in module housings 30a-30f and using tie rods 28a, 28b, 28c and 28d therethrough to clamp module housings 30a-30f together longitudinally with bolted end plates. Modules housings 30a-30f seal against each other to provide a water and dust proof stacked assembly 15. When assembled with rear covers 107a-107f in place, rear compartments 99a-99f form a common area that is open from module to module to allow communication and power bus connections to be made internally to assembly 15. In this embodiment, assembly 15 may have an Ingress Protection rating of at least IP67K. Tie rods 28a, 28b, 28c and 28d allow for the individual modules to be removable attached together in a compact stack and such that different modules may be swapped in and out and also such that modules may be added or removed from the stack as desired. While modular stack 15 is shown in this embodiment being held together with tie rod attachment 28a, 28b, 28c and 28d, other attachment systems may be employed as alternatives. For example, and without limitation, the modules may be individually connected to each other by bolts between adjacent modules, or other clamping or tensioning devices may be used to attach the modules in a coolant communicating stack.

Figure 6:
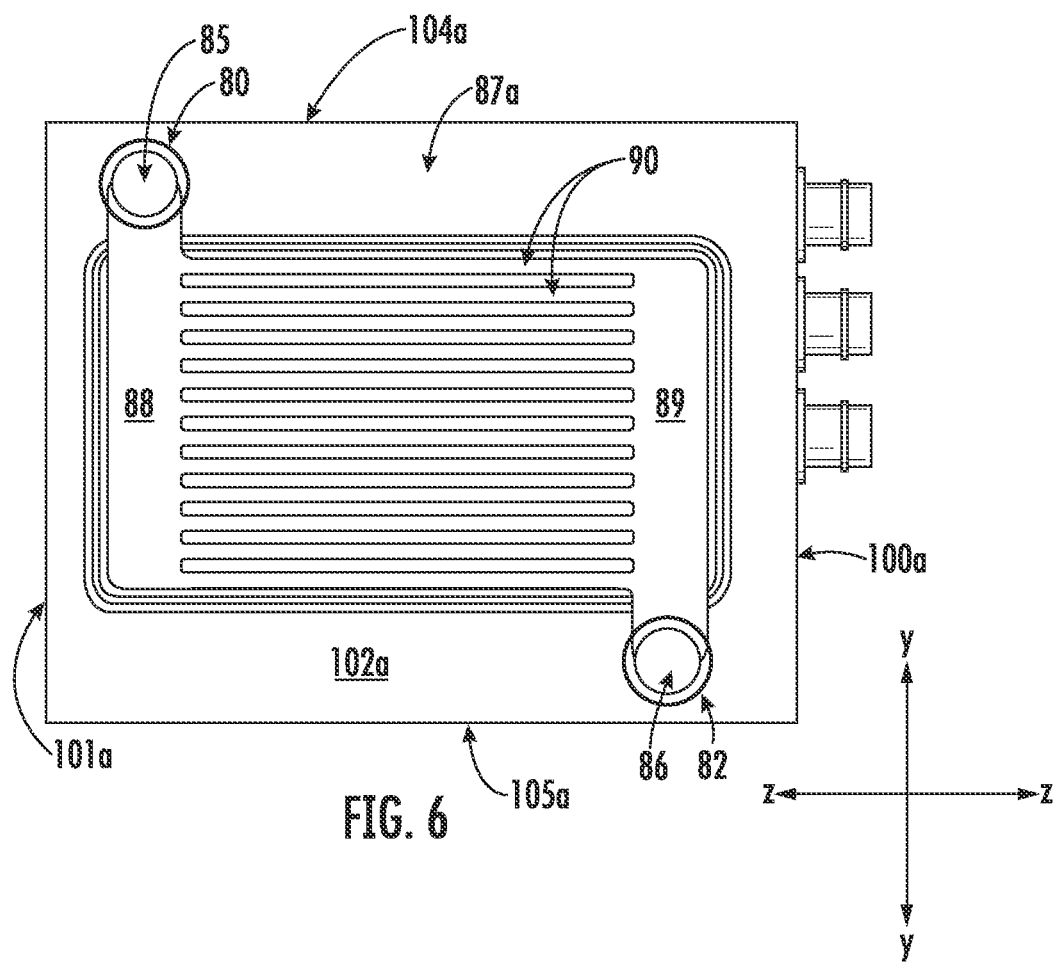
FIG. 6 is a partial vertical lateral sectional view of the actuator control module shown in FIG. 5 illustrating a first embodiment internal cooling conduit profile.

As shown, the left side of actuator module 18 includes two liquid coolant ports 80a, 82a and the right side of actuator module 18 includes two liquid coolant ports 81a, 83a. Horizontal interior coolant passage 85a extends directly between opposed ports 80a and 81a. In this embodiment, ports 80a and 81a are located in the upper left and right rear corners of module unit 18 and coolant passage 85a extends horizontally in the longitudinal direction x-x therebetween. Horizontal coolant passage 86a extends directly between opposed ports 82a and 83a. In this embodiment, ports 82a and 83a are located in the lower left and right front corners of module unit 18 and coolant passage 86a extends horizontally in longitudinal direction x-x therebetween. An interior power electronics coolant flow path 87a is provided between upper coolant passage 85a and lower coolant passage 86a. With reference to FIG. 6, in this embodiment, the profile of coolant passage path 87a comprises rear vertical chamber 88 extending down from passage 85 in transverse direction y-y, front vertical chamber 89 extending up from passage 86 in transverse direction y-y, and a plurality of laterally extending and vertically spaced parallel coolant channels, severally indicated at 90, that extend between rear vertical chamber 88*a* and front vertical chamber 89*a* and are located in close thermal proximity to power electronics 31*a*.

As explained further below, each of ports 80*a*, 81*a*, 82*a* and 83*a* in housing 30*a* of module 18 are configured to be plugged to allow for alternate coolant configurations if desired. In addition, housing 30*a* of module 18 includes a number of alternate coolant ports to allow for the supply of coolant from alternate faces or sides of housing 30*a* of module 18 if desired. In particular, front port 91*a* is provided into interior coolant passage 86*a* from the front side 100*a* of module 18, bottom port 92*a* is provided into interior coolant passage 86*a* from the bottom side 105*a* of module 18, and top port 93*a* is provided into interior coolant passage 85*a* from the top side 104*a* of module 18. Unless a particular alternate cooling configuration is desired, ports 91*a*, 92*a* and 93*a* are plugged, as shown in FIG. 1.

Similar to module 18, the left side of actuator module 19 includes two liquid coolant ports 80*b*, 82*b* and the right side of actuator module 19 includes two liquid coolant ports 81*b*, 83*b*. Horizontal interior coolant passage 85*b* extends directly between opposed ports 80*b* and 81*b*. In this embodiment, ports 80*b* and 81*b* are located in the upper left and right rear corners of module unit 19 and coolant passage 85*b* extends horizontally in the longitudinal direction x-x therebetween. Horizontal coolant passage 86*b* extends directly between opposed ports 82*b* and 83*b*. In this embodiment, ports 82*b* and 83*b* are located in the lower left and right front corners of module unit 19 and coolant passage 86*b* extends horizontally in longitudinal direction x-x therebetween. An interior power electronics coolant flow path 87*b* is provided between upper coolant passage 85*b* and lower coolant passage 86*b*. In this embodiment, the profile of coolant passage path 87*b* is the same as coolant path 87*a* of module 18, with rear vertical chamber 89 extending down from passage 85*b* in transverse direction y-y, front vertical chamber 89 extending up from passage 86*b* in transverse direction y-y, and a plurality of laterally extending and vertically spaced parallel coolant channels 90 extending between rear vertical chamber 88 and front vertical chamber 89 and located in close thermal proximity to power electronics 31*b*.

As explained further below, each of ports 80*b*, 81*b*, 82*b* and 83*b* in housing 30*b* of module 19 are configured to be plugged to allow for alternate coolant configurations if desired. In additional, housing 30*b* of module 19 includes a number of alternate coolant ports to allow for the supply of coolant from alternate faces or sides of housing 30*b* of module 19 if desired. In particular, front port 91*b* is provided into interior coolant passage 86*b* from the front side 100*b* of module 19, bottom port 92*b* is provided into interior coolant passage 86*b* from the bottom side 105*b* of module 19, and top port 93*b* is provided into interior coolant passage 85*b* from the top side 104*b* of module 19. Unless a particular alternate cooling configuration is desired, ports 91*b*, 92*b* and 93*b* are plugged, as shown in FIG. 1.

Similar to module 19, the left side of actuator module 20 includes two liquid coolant ports 80*c*, 82*c* and the right side of actuator module 20 includes two liquid coolant ports 81*c*, 83*c*. Horizontal interior coolant passage 85*c* extends directly between opposed ports 80*c* and 81*c*. In this embodiment, ports 80*c* and 81*c* are located in the upper left and right rear corners of module unit 20 and coolant passage 85*c* extends horizontally in the longitudinal direction x-x therebetween. Horizontal coolant passage 86*c* extends directly between opposed ports 82*c* and 83*c*. In this embodiment, ports 82*c* and 83*c* are located in the lower left and right front corners of module unit 20 and coolant passage 86*c* extends horizontally in longitudinal direction x-x therebetween. An interior power electronics coolant flow path 87*c* is provided between upper coolant passage 85*c* and lower coolant passage 86*c*. In this embodiment, the profile of coolant passage path 87*c* is the same as coolant path 87*a* of module 18, with rear vertical chamber 89 extending down from passage 85*c* in transverse direction y-y, front vertical chamber 89 extending up from passage 86*c* in transverse direction y-y, and a plurality of laterally extending and vertically spaced parallel coolant channels 90 extending between rear vertical chamber 88 and front vertical chamber 89 and located in close thermal proximity to power electronics 31*c*.

As explained further below, each of ports 80*c*, 81*c*, 82*c* and 83*c* in housing 30*c* of module 20 are configured to be plugged to allow for alternate coolant configurations if desired. In additional, housing 30*c* of module 20 includes a number of alternate coolant ports to allow for the supply of coolant from alternate faces or sides of housing 30*c* of module 20 if desired. In particular, front port 91*c* is provided into interior coolant passage 86*c* from the front side 100*c* of module 20, bottom port 92*c* is provided into interior coolant passage 86*c* from the bottom side 105*c* of module 20, and top port 93*c* is provided into interior coolant passage 85*c* from the top side 104*c* of module 20. Unless a particular alternate cooling configuration is desired, ports 91*c*, 92*c* and 93*c* are plugged, as shown in FIG. 1.

Similar to module 20, the left side of actuator module 21 includes two liquid coolant ports 80*d*, 82*d* and the right side of actuator module 21 includes two liquid coolant ports 81*d*, 83*d*. Horizontal interior coolant passage 85*d* extends directly between opposed ports 80*d* and 81*d*. In this embodiment, ports 80*d* and 81*d* are located in the upper left and right rear corners of module unit 21 and coolant passage 85*d* extends horizontally in the longitudinal direction x-x therebetween. Horizontal coolant passage 86*d* extends directly between opposed ports 82*d* and 83*d*. In this embodiment, ports 82*d* and 83*d* are located in the lower left and right front corners of module unit 21 and coolant passage 86*d* extends horizontally in longitudinal direction x-x therebetween. An interior power electronics coolant flow path 87*d* is provided between upper coolant passage 85*d* and lower coolant passage 86*d*. In this embodiment, the profile of coolant passage path 87*d* is the same as coolant path 87*a* of module 18, with rear vertical chamber 89 extending down from passage 85*d* in transverse direction y-y, front vertical chamber 89 extending up from passage 86*d* in transverse direction y-y, and a plurality of laterally extending and vertically spaced parallel coolant channels 90 extending between rear vertical chamber 88 and front vertical chamber 89 and located in close thermal proximity to power electronics 31*e* and 31*f*.

As explained further below, each of ports 80*d*, 81*d*, 82*d* and 83*d* in housing 30*d* of module 21 are configured to be plugged to allow for alternate coolant configurations if desired. In additional, housing 30*d* of module 21 includes a number of alternate coolant ports to allow for the supply of coolant from alternate faces or sides of housing 30*d* of module 21 if desired. In particular, front port 91*d* is provided into interior coolant passage 86*d* from the front side 100*d* of module 21, bottom port 92*d* is provided into interior coolant passage 86*d* from the bottom side 105*d* of module 21, and top port 93*d* is provided into interior coolant passage 85*d* from the top side 104*d* of module 21. Unless a particular alternate cooling configuration is desired, ports 91d, 92d and 93d are plugged, as shown in FIG. 1.

Similar to module 20, the left side of central power control module 17 includes two liquid coolant ports 80e, 82e and the right side of central power control module 17 includes two liquid coolant ports 81e, 83e. Horizontal interior coolant passage 85e extends directly between opposed ports 80e and 81e. In this embodiment, ports 80e and 81e are located in the upper left and right rear corners of module unit 17 and coolant passage 85e extends horizontally in the longitudinal direction x-x therebetween. Horizontal coolant passage 86e extends directly between opposed ports 82e and 83e. In this embodiment, ports 82e and 83e are located in the lower left and right front corners of module unit 17 and coolant passage 86e extends horizontally in longitudinal direction x-x therebetween. An interior central power management electronics coolant flow path 87e is provided between upper coolant passage 85e and lower coolant passage 86e. In this embodiment, the profile of coolant passage path 87e is the same as coolant path 87a of module 18, with rear vertical chamber 89 extending down from passage 85e in transverse direction y-y, front vertical chamber 89 extending up from passage 86e in transverse direction y-y, and a plurality of laterally extending and vertically spaced parallel coolant channels 90 extending between rear vertical chamber 88 and front vertical chamber 89 and located in close thermal proximity to central power management electronics 51.

As explained further below, each of ports 80e, 81e, 82e and 83e in housing 30e of module unit 17 are configured to be plugged to allow for alternate coolant configurations if desired. In additional, housing 30e of module unit 17 includes a number of alternate coolant ports to allow for the supply or discharge of coolant from alternate faces or sides of housing 30e of module 17 if desired. In particular, front port 91e is provided into interior coolant passage 86e from the front side 100e of module 17, bottom port 92e is provided into interior coolant passage 86e from the bottom side 105e of module 17, and top port 93e is provided into interior coolant passage 85e from the top side 104e of module 17. Unless a particular alternate cooling configuration is desired, ports 92e and 93e are plugged. As explained further below, with central control module 16 stacked to the right of module 17 and in a certain combined series and parallel cooling configuration, alternate port 91e may be unplugged and employed as an outlet port, as shown in FIG. 1.

Figure 7:
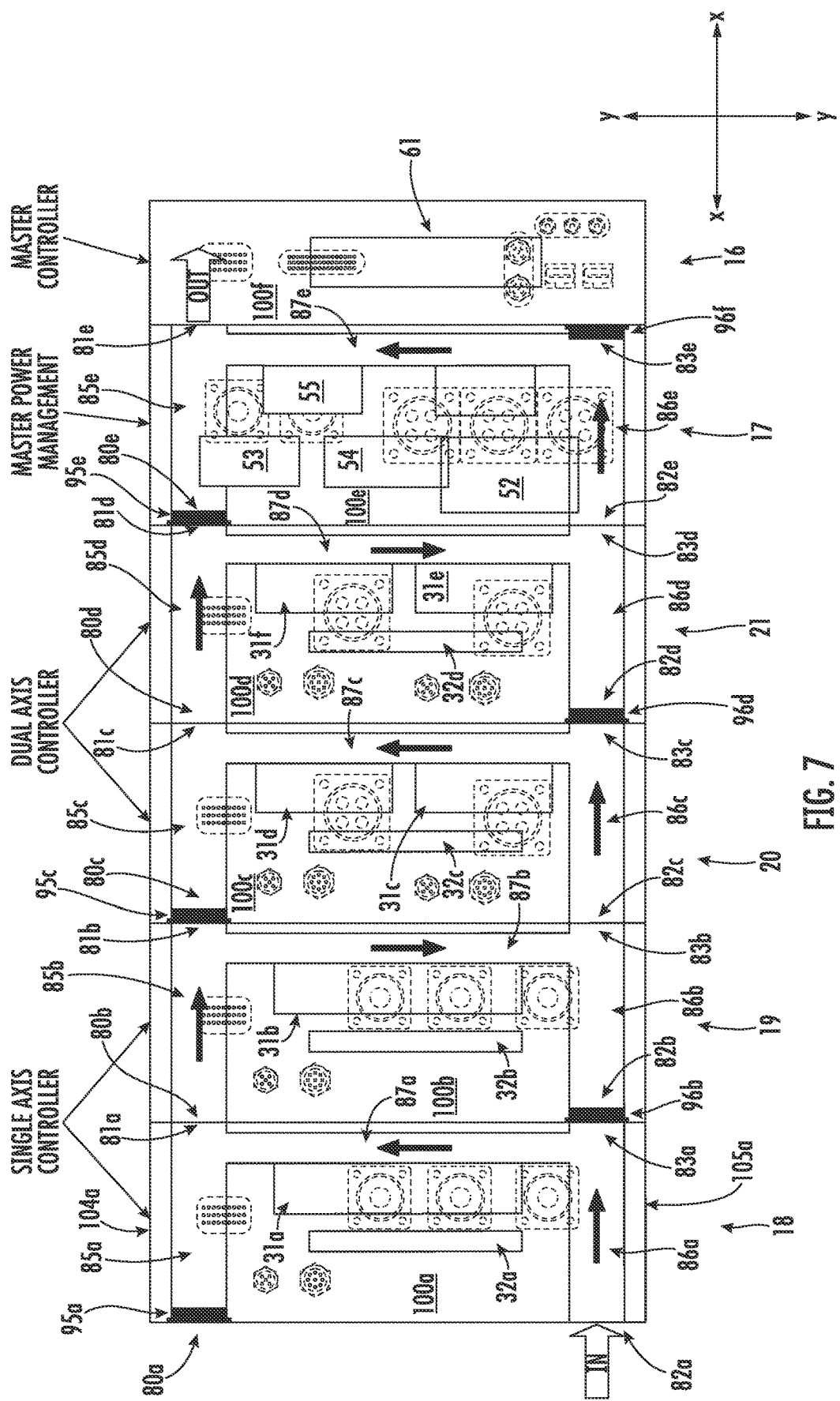
FIG. 7 is a vertical longitudinal sectional schematic view of the actuator control system shown in FIG. 1 in a series cooling stacked configuration.

The porting and cooling passage design of modules 17-21 allows for the cooling flow paths of assembly 15 to be tailored to achieve the flow and pressure drop requirements for a particular application simply by the positioning of plugs. Thus, using the same modules, the flow paths can be series, parallel, or a combination of both series and parallel and may be tuned to specific requirements. FIG. 7 shows a series flow path cooling configuration, In the series cooling configuration shown in FIG. 7, left upper side port 80a is plugged with plug 95a and right lower port 83a is blocked by plug 96b. Coolant is supplied via left lower port 82a and circulation pump 45 to passage 86a and, because of plug 96b blocking port 83a, into vertical chamber 89 of coolant flow path 87a. Coolant is then directed into each of horizontal laterally extending parallel channels 90 of coolant flow path 87a and flows from the front to the rear of module 18 at the different heights of channels 90 to thereby cool power electronics 31a, which are located in close thermal proximity to cooling channels 90. The fluid coolant exits the rear of channels 90 into rear vertical chamber 88 of coolant flow path 87a. Because of plug 95a in port 80a, the coolant is directed to exit module 18 via right upper port 81a. Accordingly, in this serial flow cooling configuration, module 18 receives coolant through a single inlet port 82a and discharges coolant through a single outlet port 81a.

With modules 18 and 19 stacked side-to-side, right upper port 81a of module 18 is aligned and in sealed fluid communication with left upper port 80b of module 19. Coolant thereby exits right upper port 81a of module 18 into left upper port 80b of module 19. Left lower side port 82b is plugged with plug 96b and right upper port 81b is blocked by plug 95c. Coolant is supplied via left upper port 80b and circulation pump 45 to passage 85b and, because of plug 95c blocking port 81b, into rear vertical chamber 88 of coolant flow path 87b. Coolant is then directed into each of horizontal laterally extending parallel channels 90 of coolant flow path 87b and flows from the rear to the front of module 19 at the different heights of channels 90 to thereby cool power electronics 31b, which are located in close thermal proximity to cooling channels 90. The fluid coolant exits the front of channels 90 into front vertical chamber 89 of coolant flow path 87b. Because of plug 96b in port 82b, the coolant is directed to exit module 19 via right lower port 83b. Accordingly, in this serial flow cooling profile, module 19 receives coolant through a single inlet port 80b and discharges coolant through a single outlet port 83b.

With modules 19 and 20 stacked side-to-side, right lower port 83b of module 19 is aligned and in sealed fluid communication with left lower port 82c of module 20. Coolant thereby exits right lower port 83b of module 19 into left lower port 82c of module 20. Left upper side port 80c is plugged with plug 95c and right lower port 83c is blocked by plug 96d. Coolant is supplied via left lower port 82c and circulation pump 45 to passage 86c and, because of plug 96d blocking port 83c, into vertical front chamber 89 of coolant flow path 87c. Coolant is then directed into each of horizontal laterally extending parallel channels 90 of coolant flow path 87c and flows from the front to the rear of module 20 at the different heights of channels 90 to thereby cool power electronics 31c and 31d, which are located in close thermal proximity to cooling channels 90. The fluid coolant exits the rear of channels 90 into rear vertical chamber 88 of coolant flow path 87b. Because of plug 95c in port 80c, the coolant is directed to exit module 20 via right upper port 81c. Accordingly, in this serial flow cooling profile, module 20 receives coolant through a single inlet port 82c and discharges coolant through a single outlet port 81c.

With modules 20 and 21 stacked side-to-side, right upper port 81c of module 20 is aligned and in sealed fluid communication with left upper port 80d of module 21. Coolant thereby exits right upper port 81c of module 20 into left upper port 80d of module 21. Left lower side port 82d is plugged with plug 96d and right upper port 81d is blocked by plug 95e. Coolant is supplied via left upper port 80d and circulation pump 45 to passage 85d and, because of plug 95e blocking port 81d, into rear vertical chamber 88 of coolant flow path 87d. Coolant is then directed into each of horizontal laterally extending parallel channels 90 of coolant flow path 87d and flows from the rear to the front of module 19 at the different heights of channels 90 to thereby cool power electronics 31f and 31g, which are located in close thermal proximity to cooling channels 90. The fluid coolant exits the front of channels 90 into front vertical chamber 89 of coolant flow path 87d. Because of plug 96d in port 82d, the coolant is directed to exit module 21 via right lower port 83d. Accordingly, in this serial flow cooling profile, module 21 receives coolant through a single inlet port 80*d* and discharges coolant through a single outlet port 83*d*.

With modules 21 and 17 stacked side-to-side, right lower port 83*d* of module 21 is aligned and in sealed fluid communication with left lower port 82*e* of module 17. Coolant thereby exits right lower port 83*d* of module 21 into left lower port 82*e* of module 17. Left upper side port 80*e* is plugged with plug 95*e* and right lower port 83*e* is blocked by plug 96*f*. Coolant is supplied via left lower port 82*e* and circulation pump 45 to passage 86*e* and, because of plug 96*f* blocking port 83*e*, into vertical front chamber 89 of coolant flow path 87*e*. Coolant is then directed into each of horizontal laterally extending parallel channels 90 of coolant flow path 87*e* and flows from the front to the rear of module 17 at the different heights of channels 90 to thereby cool central power management electronics 51, including control power electronics 55, which are located in close thermal proximity to cooling channels 90. The fluid coolant exits the rear of channels 90 into rear vertical chamber 88 of coolant flow path 87*c*. Because of plug 95*e* in port 80*e*, the coolant is directed to exit module 17 via right upper port 81*e*. Accordingly, in this serial flow cooling profile, module 20 receives coolant through a single inlet port 82*e* and discharges coolant through a single outlet port 81*e*. In the embodiment shown in FIG. 1, with central control module 16 stacked to the right of module 17 and because central control module 16 does not include any coolant channels in this embodiment, port 81*e* may be plugged and alternate port 93*e* may be unplugged and employed as an outlet port. Accordingly, in this serial flow cooling profile, module 17 receives coolant through a single inlet port 82*e* and discharges coolant through a single outlet port 81*e* or 93*e*.

Figure 8:
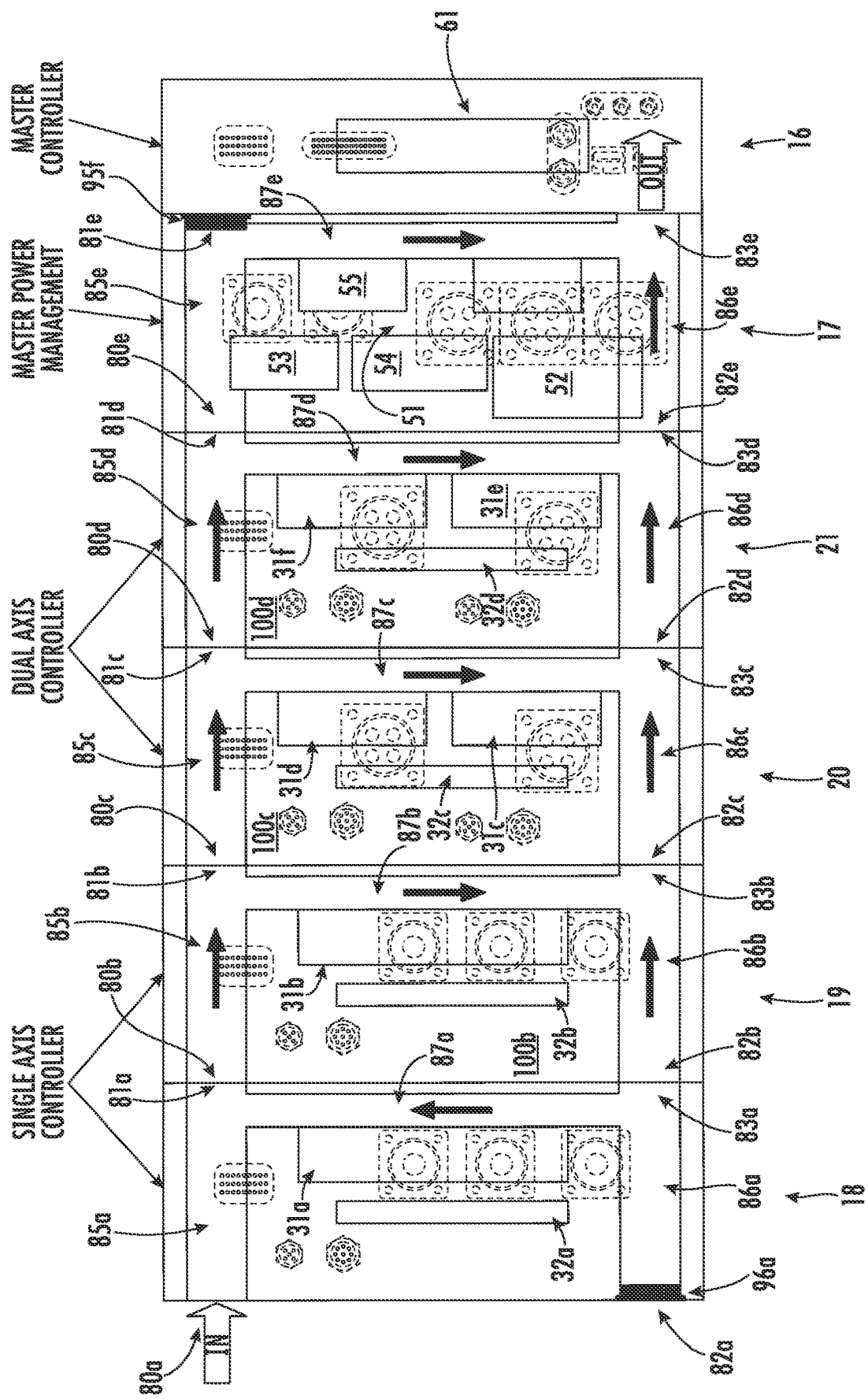
FIG. 8 is a vertical longitudinal sectional schematic view of the actuator control system shown in FIG. 1 in a parallel cooling stacked configuration.

FIG. 8 shows a parallel flow path cooling configuration. In the parallel cooling configuration shown in FIG. 8, left lower side port 82*a* is plugged with plug 96*a*. Neither of right upper port 81*a* or right lower port 83*a* of module 18 are plugged. Also, neither of left upper port 80*b* or left lower port 82*b* of module 19 are plugged. Coolant is supplied via left upper port 80*a* and circulation pump 45 to passage 85*a*. Coolant is directed to flow both through passage 85*a* to right upper port 81*a* as well as into vertical rear chamber 88 of coolant flow path 87*a*. From vertical rear chamber 88 of coolant flow path 87*a*, coolant flows into each of horizontal laterally extending parallel channels 90 of coolant flow path 87*a* and flows from the rear to the front of module 18 at the different heights of channels 90 to thereby cool power electronics 31*a*, which are located in close thermal proximity to cooling channels 90. The fluid coolant exits the front of channels 90 into front vertical chamber 89 of coolant flow path 87*a*. Because of plug 96*a* in port 82*a*, the coolant is directed to exit module 18 via either right upper port 81*a* or right lower port 83*a*. Accordingly, in this parallel flow cooling configuration, module 18 receives coolant through at least inlet port 80*a* and discharges coolant through two parallel outlet ports 81*a* and 83*a*.

With modules 18 and 19 stacked side-to-side, right upper port 81*a* of module 18 is aligned and in sealed fluid communication with left upper port 80*b* of module 19. Coolant thereby exits right upper port 81*a* of module 18 into left upper port 80*b* of module 19. Also, right lower port 83*a* of module 18 is aligned and in sealed fluid communication with left lower port 82*b* of module 19. Coolant thereby also exits right lower port 83*a* of module 18 into left lower port 82*b* of module 19. Neither of right upper port 81*b* or right lower port 83*b* of module 19 are plugged. Also, neither of left upper port 80*c* or left lower port 82*c* of module 20 are plugged. Coolant is supplied via left upper port 80*b* to passage 85*b* and via left lower port 82*b* to passage 86*b*. Coolant is directed to flow through passage 85*b* to right upper port 81*b*, through passage 86*b* to right lower port 83*b*, as well as into channels 90 of coolant flow path 87*b* to thereby cool power electronics 31*b*. Accordingly, in this parallel flow cooling configuration, module 19 receives coolant through two parallel inlet ports 80*b* and 82*b* and discharges coolant through two parallel outlet ports 81*b* and 83*b*.

With modules 19 and 20 stacked side-to-side, right upper port 81*b* of module 19 is aligned and in sealed fluid communication with left upper port 80*c* of module 20. Coolant thereby exits right upper port 81*b* of module 19 into left upper port 80*c* of module 20. Also, right lower port 83*b* of module 19 is aligned and in sealed fluid communication with left lower port 82*c* of module 20. Coolant thereby also exits right lower port 83*b* of module 19 into left lower port 82*c* of module 20. Neither of right upper port 81*c* or right lower port 83*c* of module 20 are plugged. Also, neither of left upper port 80*c* or left lower port 82*d* of module 21 are plugged. Coolant is supplied via left upper port 80*c* to passage 85*c* and via left lower port 82*c* to passage 86*c*. Coolant is directed to flow through passage 85*c* to right upper port 81*c*, through passage 86*c* to right lower port 83*c*, as well as into channels 90 of coolant flow path 87*c* to thereby cool power electronics 31*c* and 31*d*. Accordingly, in this parallel flow cooling configuration, module 20 receives coolant through two parallel inlet ports 80*c* and 82*c* and discharges coolant through two parallel outlet ports 81*c* and 83*c*.

With modules 20 and 21 stacked side-to-side, right upper port 81*c* of module 20 is aligned and in sealed fluid communication with left upper port 80*d* of module 21. Coolant thereby exits right upper port 81*c* of module 20 into left upper port 80*d* of module 21. Also, right lower port 83*c* of module 20 is aligned and in sealed fluid communication with left lower port 82*d* of module 21. Coolant thereby also exits right lower port 83*c* of module 20 into left lower port 82*d* of module 21. Neither of right upper port 81*d* or right lower port 83*d* of module 21 are plugged. Also, neither of left upper port 80*e* or left lower port 82*e* of module 17 are plugged. Coolant is supplied via left upper port 80*d* to passage 85*d* and via left lower port 82*d* to passage 86*d*. Coolant is directed to flow through passage 85*d* to right upper port 81*d*, through passage 86*d* to right lower port 83*d*, as well as into channels 90 of coolant flow path 87*d* to thereby cool power electronics 31*e* and 31*f*. Accordingly, in this parallel flow cooling configuration, module 21 receives coolant through two parallel inlet ports 80*d* and 82*d* and discharges coolant through two parallel outlet ports 81*d* and 83*d*.

With modules 21 and 17 stacked side-to-side, right upper port 81*d* of module 21 is aligned and in sealed fluid communication with left upper port 80*e* of module 17. Coolant thereby exits right upper port 81*d* of module 21 into left upper port 80*e* of module 17. Also, right lower port 83*d* of module 21 is aligned and in sealed fluid communication with left lower port 82*e* of module 17. Coolant thereby also exits right lower port 83*d* of module 21 into left lower port 82*e* of module 17. Coolant is supplied via left upper port 80*e* to passage 85*e* and via left lower port 82*e* to passage 86*e*. Right upper side port 81*e* is plugged with plug 95*f*. Coolant is directed to flow both through passage 86*e* to right lower port 83*e* as well as through passage 85*e* into vertical rear chamber 88 of coolant flow path 87*e*. From vertical rear chamber 88 of coolant flow path 87*e*, coolant flows into each of horizontal laterally extending parallel channels 90 of coolant flow path 87e and flows from the rear to the front of module 17 at the different heights of channels 90 to thereby cool electronics 51, which are located in close proximity to cooling channels 90. The fluid coolant exits the front of channels 90 into front vertical chamber 89 of coolant flow path 87e and exits module 17 via right lower port 83e. In the embodiment shown in FIG. 1, with central control module 16 stacked to the right of module 17 and because central control module 16 does not include any coolant channels in this embodiment, port 83e may be plugged and alternate port 91e may be unplugged and employed as an outlet port. Accordingly, in this parallel flow cooling configuration, module 17 receives coolant through two parallel inlet ports 80e and 82e and discharges coolant through at least outlet port 83e or 91e.

Figure 9:
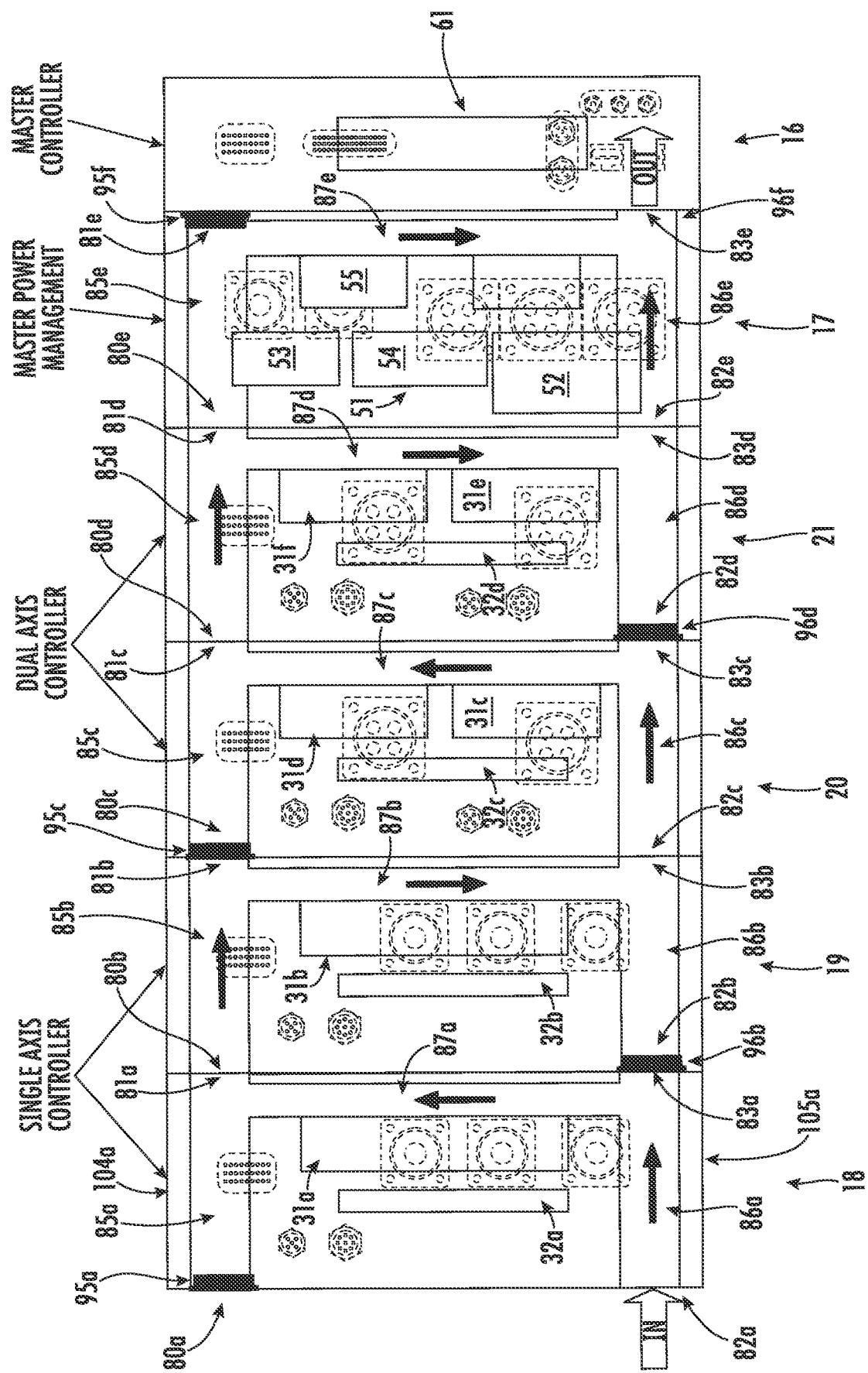
FIG. 9 is a vertical longitudinal sectional schematic view of the actuator control system shown in FIG. 1 in a combined serial and parallel cooling stacked configuration.
Figure 10:
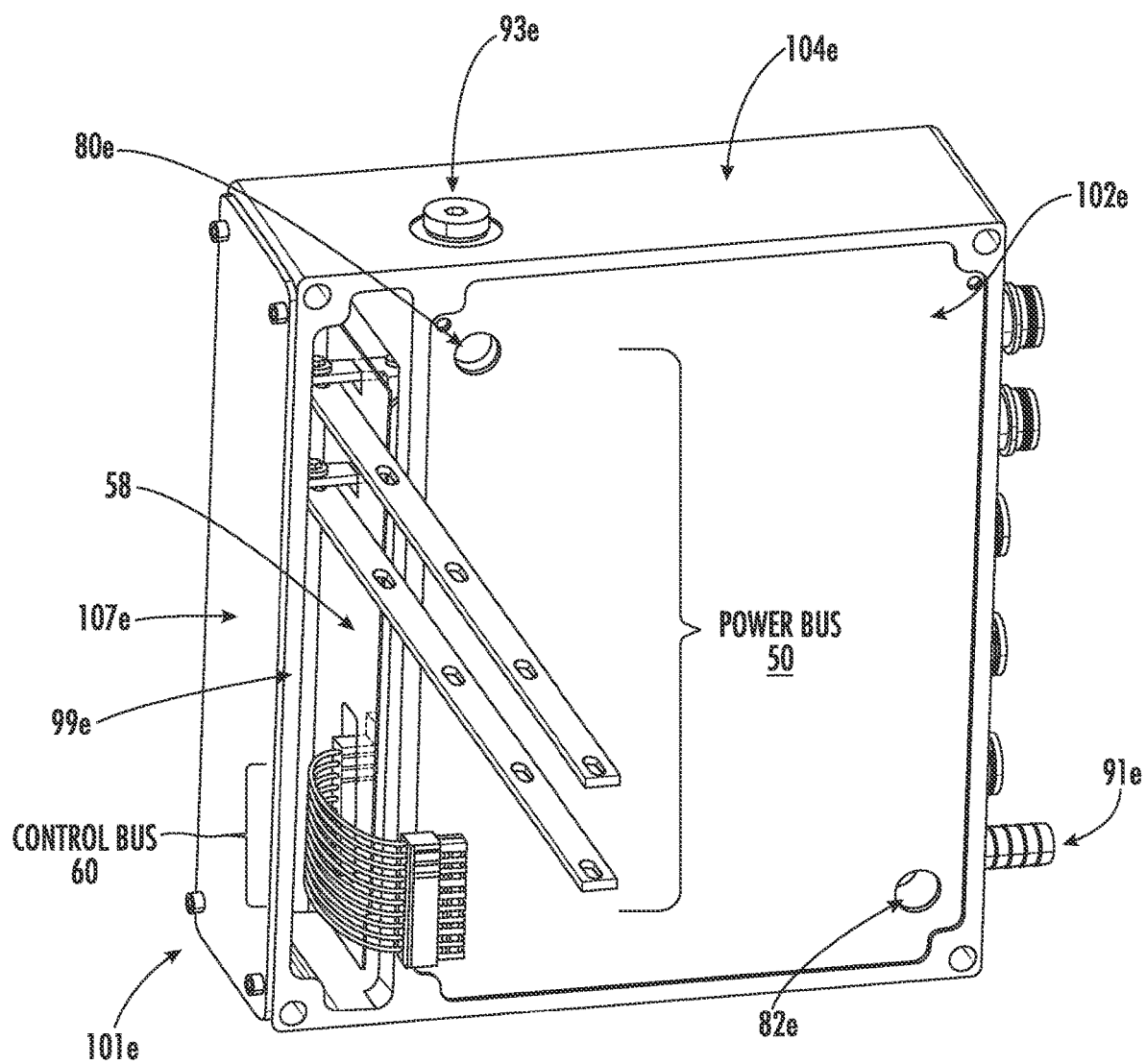
FIG. 10 is a left side isometric view of the power management module shown in FIG. 1.

FIG. 9 shows a combined series and parallel flow path cooling configuration, In the combined series and parallel cooling configuration shown in FIG. 9, left upper side port 80a is plugged with plug 95a and right lower port 83a is blocked by plug 96b. Coolant is supplied via left lower port 82a and circulation pump 45 to passage 86a and, because of plug 96b blocking port 83a, into vertical chamber 89 of coolant flow path 87a. Coolant is then directed into each of horizontal laterally extending parallel channels 90 of coolant flow path 87a and flows from the front to the rear of module 18 at the different heights of channels 90 to thereby cool power electronics 31a, which are located in close thermal proximity to cooling channels 90. The fluid coolant exits the rear of channels 90 into rear vertical chamber 88 of coolant flow path 87a. Because of plug 95a in port 80a, the coolant is directed to exit module 18 via right upper port 81a. Accordingly, module 18 is in a serial flow cooling configuration and receives coolant through a single inlet port 82a and discharges coolant through a single outlet port 81a.

With modules 18 and 19 stacked side-to-side, right upper port 81a of module 18 is aligned and in sealed fluid communication with left upper port 80b of module 19. Coolant thereby exits right upper port 81a of module 18 into left upper port 80b of module 19. Left lower side port 82b is plugged with plug 96b and right upper port 81b is blocked by plug 95c. Coolant is supplied via left upper port 80b and circulation pump 45 to passage 85b and, because of plug 95c blocking port 81b, into rear vertical chamber 88 of coolant flow path 87b. Coolant is then directed into each of horizontal laterally extending parallel channels 90 of coolant flow path 87b and flows from the rear to the front of module 19 at the different heights of channels 90 to thereby cool power electronics 31b, which are located in close thermal proximity to cooling channels 90. The fluid coolant exits the front of channels 90 into front vertical chamber 89 of coolant flow path 87b. Because of plug 96b in port 82b, the coolant is directed to exit module 19 via right lower port 83b. Accordingly, modules 18 and 19 are in a serial flow cooling configuration and module 19 receives coolant through a single inlet port 80b and discharges coolant through a single outlet port 83b.

With modules 19 and 20 stacked side-to-side, right lower port 83b of module 19 is aligned and in sealed fluid communication with left lower port 82c of module 20. Coolant thereby exits right lower port 83b of module 19 into left lower port 82c of module 20. Left upper side port 80c is plugged with plug 95c and right lower port 83c is blocked by plug 96d. Coolant is supplied via left lower port 82c and circulation pump 45 to passage 86c and, because of plug 96d blocking port 83c, into vertical front chamber 89 of coolant flow path 87c. Coolant is then directed into each of horizontal laterally extending parallel channels 90 of coolant flow path 87c and flows from the front to the rear of module 20 at the different heights of channels 90 to thereby cool power electronics 31c and 31d, which are located in close thermal proximity to cooling channels 90. The fluid coolant exits the rear of channels 90 into rear vertical chamber 88 of coolant flow path 87b. Because of plug 95c in port 80c, the coolant is directed to exit module 20 via right upper port 81c. Accordingly, modules 18, 19 and 20 are in a serial flow cooling configuration and module 20 receives coolant through a single inlet port 82c and discharges coolant through a single outlet port 81c.

With modules 20 and 21 stacked side-to-side, right upper port 81c of module 20 is aligned and in sealed fluid communication with left upper port 80d of module 21. Coolant thereby exits right upper port 81c of module 20 into left upper port 80d of module 21. Left lower side port 82d is plugged with plug 96d. Neither of right upper port 81d or right lower port 83d of module 21 are plugged. Also, neither of left upper port 80e or left lower port 82e of module 17 are plugged. Coolant is supplied via left upper port 80d and circulation pump 45 to passage 85d. Coolant is directed to flow both through passage 85d to right upper port 81d as well as into vertical rear chamber 88 of coolant flow path 87d. From vertical rear chamber 88 of coolant flow path 87d, coolant flows into each of horizontal laterally extending parallel channels 90 of coolant flow path 87d and flows from the rear to the front of module 21 at the different heights of channels 90 to thereby cool power electronics 31e and 31f, which are located in close thermal proximity to cooling channels 90. The fluid coolant exits the front of channels 90 into front vertical chamber 89 of coolant flow path 87d. Because of plug 96d in port 82d, the coolant is directed to exit module 21 via either right upper port 81d or right lower port 83d. Accordingly, module 18 is in a parallel flow cooling configuration and receives coolant through at least inlet port 80d and discharges coolant through two parallel outlet ports 81d and 83d.

With modules 21 and 17 stacked side-to-side, right upper port 81d of module 21 is aligned and in sealed fluid communication with left upper port 80e of module 17. Coolant thereby exits right upper port 81d of module 21 into left upper port 80e of module 17. Also, right lower port 83d of module 21 is aligned and in sealed fluid communication with left lower port 82e of module 17. Coolant thereby also exits right lower port 83d of module 21 into left lower port 82e of module 17. Coolant is supplied via left upper port 80e to passage 85e and via left lower port 82e to passage 86e. Right upper side port 81e is plugged with plug 95f. Coolant is directed to flow both through passage 86e to right lower port 83e as well as through passage 85e into vertical rear chamber 88 of coolant flow path 87e. From vertical rear chamber 88 of coolant flow path 87e, coolant flows into each of horizontal laterally extending parallel channels 90 of coolant flow path 87e and flows from the rear to the front of module 17 at the different heights of channels 90 to thereby cool electronics 51, which are located in close thermal proximity to cooling channels 90. The fluid coolant exits the front of channels 90 into front vertical chamber 89 of coolant flow path 87e and exits module 17 via right lower port 83e. In the embodiment shown in FIG. 1, with central control module 16 stacked to the right of module 17 and because central control module 16 does not include any coolant channels in this embodiment, port 83e may be plugged and alternate port 91e may be unplugged and employed as an outlet port. Accordingly, module 21 and 17 are in a parallel flow cooling configuration and module 17 receives coolant through two parallel inlet ports 80e and 82e and discharges coolant through at least outlet port 83e or 91e.

Figure 11:
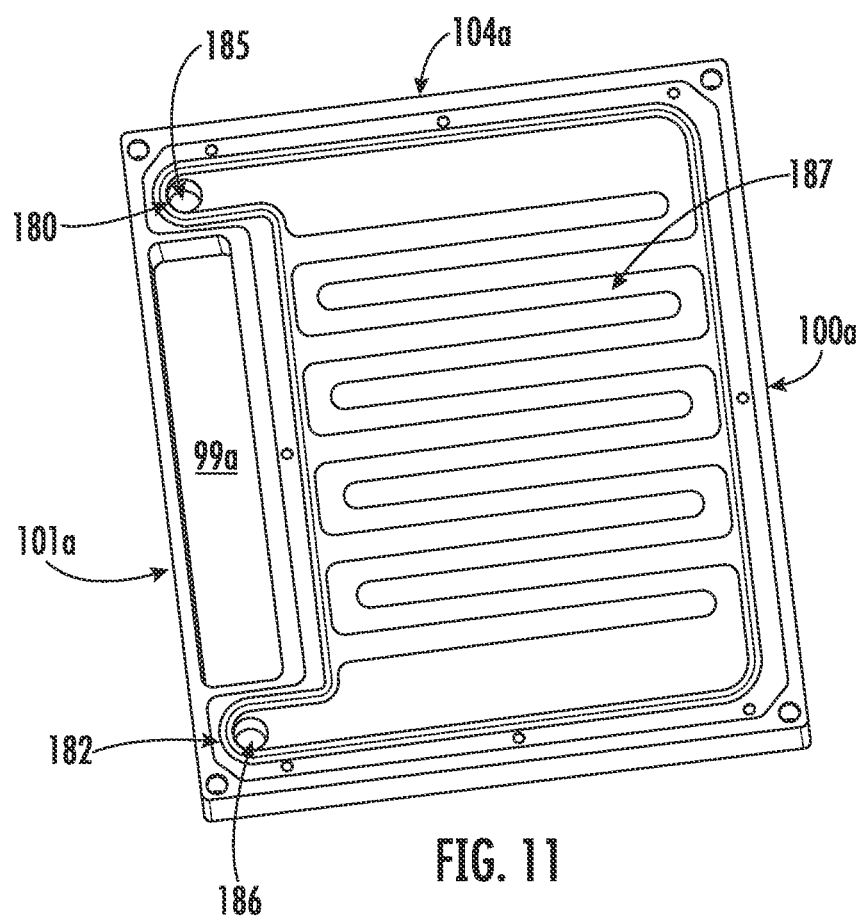
FIG. 11 is an alternative second embodiment internal cooling conduit profile to the first embodiment shown in FIG. 6.

FIG. 11 shows a first alternative cooling path 187 to the cooling path 87 shown in FIG. 6. In this embodiment, the left side of the module also includes upper liquid coolant port 180 and lower liquid coolant port 182. The right side of the module includes a first liquid coolant port aligned opposite to coolant port 180 with coolant passage 185 extending horizontally in the longitudinal direction x-x therebetween, and the right side of the module includes a second liquid coolant port aligned opposite to coolant port 182 with coolant passage 186 extending horizontally in the longitudinal direction x-x therebetween. Cooling passage 185 is located in the upper left corner of module unit 118. However, in this embodiment coolant passage 186 is located in the lower left corner of the module unit. As shown, in this embodiment interior power electronics coolant flow path 187 extends as a single serpentine path between upper coolant passage 185 and lower coolant passage 186a.

Figure 12:
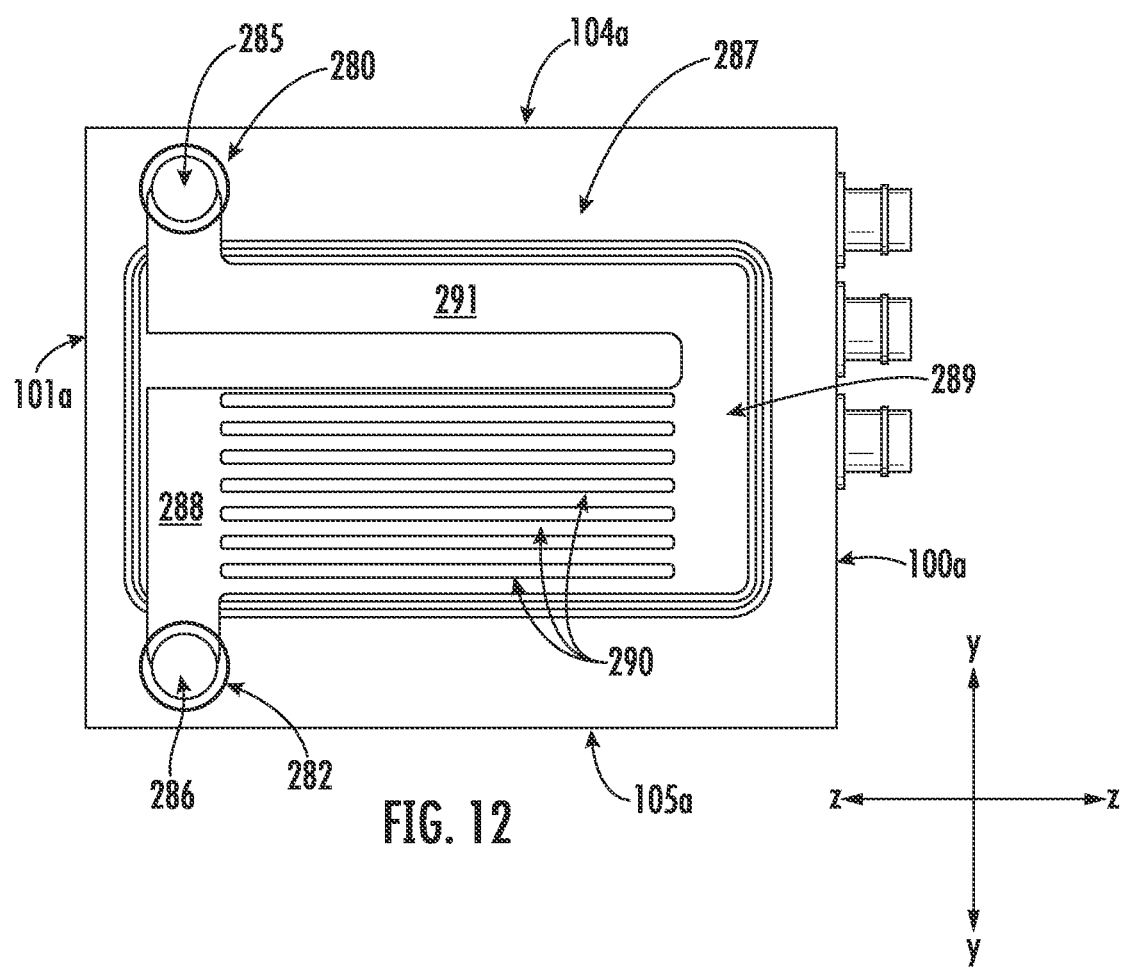
FIG. 12 is an alternative second embodiment internal cooling conduit profile to the first embodiment shown in FIG. 6

FIG. 12 shows a second alternative cooling path 287 to the cooling path 87 shown in FIG. 6. As with the embodiment shown in FIG. 11, in this embodiment, the left side of the module includes upper liquid coolant port 280 and lower liquid coolant port 282. The right side of the module includes a first liquid coolant port aligned opposite to coolant port 280 with coolant passage 285 extending horizontally in the longitudinal direction x-x therebetween, and the right side of the module includes a second liquid coolant port aligned opposite to coolant port 282 with coolant passage 286 extending horizontally in the longitudinal direction x-x therebetween. Cooling passage 285 is located in the upper left corner of the module unit and coolant passage 286 is located in the lower left corner of module unit 118. As shown, in this embodiment the profile of coolant passage path 287 comprises coolant channel 291 extending laterally in direction z-z from passage 285, front vertical chamber 289 extending down from passage 291 in transverse direction y-y, rear vertical chamber 288 extending up from passage 286 in transverse direction y-y, and a plurality of laterally extending and vertically spaced parallel coolant channels, severally indicated at 290, that extend between front vertical chamber 289 and rear vertical chamber 188.

While the coolant paths are shown with various geometries and conduit configurations, alternative passage geometries and porting may be used. For example, a partitioned volume of the interior of the housing may be used to provide the coolant passage or the input and output ports may be located in alternative locations through the housing and the number of such ports may be varied as desired.

Modular control system 15 has a number of advantages. System 15 provides a stack of individualized electronics modules that is liquid cooled, that is very compact, that is environmentally rugged, that is mechanically robust, that is expandable, and that is rated for environments such as compact earth moving equipment. System 15 is easily scalable and customizable. The integrated cooling passages designed into each module eliminate the need for external interconnections between them. Integrated electric bus connections, both power and control, eliminating the need for external interconnections between them. The individual stacked modular units may be customized to provide individualized desired control electronics. The number and configuration of the modular units may be varied as desired for the application and conditions of the environment. The system provides IoT data gathering, storage and transmission. The system has remote control capability and has autonomous control capability. The individual module units may also be line replaceable units (LRUs). The individual modules may have an Ingress Protection rating of at least IP44 and when placed into an assembly of multiple modules may have an Ingress Protection rating of at least IP67K. System 15 is scalable in size by adding module units to the stack as needed.

While the presently preferred form of the modular actuator control system has been shown and described, and several modifications thereof discussed, persons skilled in this art will readily appreciate that various additional changes and modifications may be made without departing from the scope of the invention, as defined and differentiated by the claims.

What is claimed is:

1. A modular actuator control system, comprising:
   a first controller module configured to control an electrically powered first actuator having at least one motion axis;
   a second controller module configured to control an electrically powered second actuator having at least one motion axis;
   said first controller module comprising:
      a first housing;
      first control electronics in said first housing;
      first power electronics in said first housing;
      a first power connection configured to connect to a master power source;
      a first communication connection configured to connect to master controller electronics;
      a first actuator power connection configured to connect said first power electronics with said first actuator;
      a first coolant inlet port;
      a first coolant outlet port; and
      a first flow path in said first housing between said first coolant inlet port and said first coolant outlet port that is configured to provide a liquid coolant to said first power electronics;
   said second controller module comprising:
      a second housing;
      second control electronics in said second housing;
      second power electronics in said second housing;
      a second power connection configured to connect to said power source;
      a second communication connection configured to connect to said master controller electronics;
      a second actuator power connection configured to connect said second power electronics with said second actuator;
      a second coolant inlet port;
      a second coolant outlet port; and
      a second flow path in said second housing between said second coolant inlet port and said second coolant outlet port that is configured to provide said liquid coolant to said second power electronics;
   an attachment connecting said first housing of said first controller module and said second housing of said second controller module;
   said first coolant inlet port of said first controller module configured to connect to a fluid coolant source; and
   said first coolant outlet port of said first controller module connected to said second coolant inlet port of said second controller module;
   wherein said first controller module and said second controller module are stacked in coolant fluid communication with each other.

2. The modular actuator control system set forth in claim 1, wherein:

said first controller module comprises a first secondary coolant outlet port and a first secondary flow path in said first housing between said first coolant inlet port and said first secondary coolant outlet port;

said first flow path is separate from said first secondary flow path;

said second controller module comprises a second secondary coolant inlet port; and said first secondary coolant outlet port of said first controller module is connected to said second secondary coolant inlet port of said second controller module;

wherein said first controller module and said second controller module are stacked in a parallel flow path coolant configuration.

3. The modular actuator control system set forth in claim 1, wherein:

said first controller module comprises a first actuator communication connection configured to connect said first controls electronics with said first actuator; and said second controller module comprises a second actuator communication connection configured to connect said second controls electronics with said second actuator.

4. The modular actuator control system set forth in claim 3, wherein:

said first actuator comprises a first sensor for sensing an operating parameter of said first actuator and said first actuator communication connection is configured to connect said first controls electronics with said first sensor of said first actuator; and said second actuator comprises a second sensor for sensing an operating parameter of said second actuator and said second actuator communication connection is configured to connect said second controls electronics with said second sensor of said second actuator.

5. The modular actuator control system set forth in claim 1, comprising a common power bus supplying electric power to said first power connection and said second power connection.

6. The modular actuator control system set forth in claim 1, comprising a common serial bus communicating with said first communication connection and said second communication connection.

7. The modular actuator control system set forth in claim 1, wherein:

said first housing comprises a first sealed electronics housing section defining a first electronics chamber substantially isolated from an outside environment and said first control electronics and said first power electronics are disposed in said first chamber; and said second housing comprises a second sealed electronics housing section defining a second electronics chamber substantially isolated from said outside environment and said second control electronics and said second power electronics are disposed in said second chamber.

8. The modular actuator control system set forth in claim 7, wherein:

said first housing comprises a first connection section defining a first connection chamber substantially isolated from said outside environment and said first power connection and said first communication connection are disposed in said first connection chamber; and said second housing comprises a second connection section defining a second connection chamber substantially isolated from said outside environment and said second power connection and said second communication connection are disposed in said second connection chamber.

9. The modular actuator control system set forth in claim 8, comprising:

a power bus supplying electric power to said first power connection and said second power connection;

a serial bus communicating with said first communication connection and said second communication connection; and said common power bus extending into said first connection chamber and said second connection chamber; and said common serial bus extending into said first connection chamber and said second connection chamber.

10. The modular actuator control system set forth in claim 1, comprising:

a master controller module comprising:
a master controller housing;
said master controller electronics disposed in said master controller housing;
a master communication connection configured to connect to said first communication connection of said first controller module and said second communication connection of said second controller module; and said attachment connecting said first housing of said first controller module, said second housing of said second controller module, and said master controller housing of said master controller module.

11. The modular actuator control system set forth in claim 10, comprising a serial bus communicating between said master communication connection, said first communication connection and said second communication connection.

12. The modular actuator control system set forth in claim 10, comprising:

a power management module comprising:
a power management housing;
power management electronics in said power management housing;
an input power connection configured to connect to said master power source;
an output control power connection configured to connect to said first control electronics and said second control electronics;
a power coolant inlet port;
a power coolant outlet port; and
a power flow path in said power management housing between said power coolant inlet port and said power coolant outlet port that is configured to provide a liquid coolant to said power management electronics; and said attachment connecting said first housing of said first controller module, said second housing of said second controller module, said master controller housing of said master controller module, and said power management housing of said power management module.

13. The modular actuator control system set forth in claim 12, wherein said master controller module comprises an input control power connection configured to connect to said output control power connection of said power management module.

14. The modular actuator control system set forth in claim 1, comprising a pump connected to said first coolant inlet port of said first controller module and operatively configured to pump said liquid coolant through said first flow path of said first housing and said second flow path of said second housing.

15. The modular actuator control system set forth in claim 14, comprising a heat exchanger connected between said second coolant outlet port of said second controller module and said first coolant inlet port of said first controller module.

16. The modular actuator control system set forth in claim 15, wherein said heat exchanger is connected between said second coolant outlet port of said second controller module and said pump.

17. The modular actuator control system set forth in claim 1, comprising a seal between said first housing of said first controller module and said second housing of said second controller module.

18. The modular actuator control system set forth in claim 12, wherein said power management module is stacked between said second controller module and said master controller module and wherein said second coolant outlet port of said second controller module is connected to said power coolant inlet port of said power management module.

19. The modular actuator control system set forth in claim 1, comprising:
- a third controller module configured to control an electrically power third actuator having at least one motion axis;
- said third controller module comprising:
  - a third housing;
  - third control electronics in said third housing;
  - third power electronics in said third housing;
  - a third power connection configured to connect to said power source;
  - a third communication connection configured to connect to said master controller electronics;
  - a third actuator power connection configured to connect said third power electronics with said third actuator;
  - a third coolant inlet port; and
  - a third coolant outlet port; and
  - a third flow path in said third housing between said third coolant inlet port and said third coolant outlet port that is configured to provide said liquid coolant to said third power electronics;
- said attachment connecting said first housing of said first controller module, said second housing of said second controller module, and said third housing of said third controller module; and
- said second coolant outlet port of said second controller module connected to said third coolant inlet port of said third controller module;
- wherein said first controller module, said second controller module, and said third controller module are stacked in coolant fluid communication with each other.

20. The modular actuator control system set forth in claim 19, wherein:
- said second controller module comprises a second secondary coolant outlet port and a second secondary flow path in said second housing between said second coolant inlet port and said second secondary coolant outlet port;
- said second flow path is separate from said second secondary flow path;
- said third controller module comprises a third secondary coolant inlet port; and
- said second secondary coolant outlet port of said second controller module is connected to said third secondary coolant inlet port of said third controller module;
- wherein said first controller module and said second controller module are stacked in a series flow path coolant configuration and said second controller module and said third controller module are stacked in a parallel flow path coolant configuration.

21. The modular actuator control system set forth in claim 1, wherein said first flow path in said first housing between said first coolant inlet port and said first coolant outlet port comprises a plurality of separate coolant passages in thermal proximity to said first power electronics.

22. The modular actuator control system set forth in claim 1, wherein said first flow path in said first housing between said first coolant inlet port and said first coolant outlet port comprises a serpentine coolant passage in thermal proximity to said first power electronics.

23. The modular actuator control system set forth in claim 12, wherein said master controller housing of said master controller module contains a braking resistor and a capacitor.

24. The modular actuator control system set forth in claim 12, wherein said power source comprises an electric-vehicle battery.

* * * * *